(12) United States Patent
Oh

(10) Patent No.: US 10,704,744 B2
(45) Date of Patent: Jul. 7, 2020

(54) LIGHT SOURCE UNIT AND LIGHT UNIT HAVING SAME

(71) Applicant: LG INNOTEK CO., LTD., Seoul (KR)

(72) Inventor: Sung Joo Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 29 days.

(21) Appl. No.: 16/074,997

(22) PCT Filed: Feb. 6, 2017

(86) PCT No.: PCT/KR2017/001309
§ 371 (c)(1),
(2) Date: Aug. 2, 2018

(87) PCT Pub. No.: WO2017/135801
PCT Pub. Date: Aug. 10, 2017

(65) Prior Publication Data
US 2019/0063695 A1   Feb. 28, 2019

(30) Foreign Application Priority Data
Feb. 5, 2016  (KR) .................. 10-2016-0014728

(51) Int. Cl.
*H01L 33/50*      (2010.01)
*F21V 5/04*       (2006.01)
(Continued)

(52) U.S. Cl.
CPC .................. *F21K 9/69* (2016.08); *F21V 5/04* (2013.01); *F21V 5/046* (2013.01); *F21V 9/32* (2018.02);
(Continued)

(58) Field of Classification Search
CPC ............................. H01L 33/58; H01L 33/483
(Continued)

(56) References Cited

U.S. PATENT DOCUMENTS

2004/0079957 A1   4/2004   Andrews et al.
2009/0207586 A1   8/2009   Arai et al.
(Continued)

FOREIGN PATENT DOCUMENTS

JP   2009-192915   8/2009
KR   10-2010-0031397   3/2010
(Continued)

OTHER PUBLICATIONS

International Search Report (with English Translation) and Written Opinion dated May 29, 2017 issued in Application No. PCT/KR2017/001309.

*Primary Examiner* — David Vu
*Assistant Examiner* — Brandon C Fox
(74) *Attorney, Agent, or Firm* — KED & Associates LLP

(57) ABSTRACT

A light source unit is disclosed in an embodiment. The disclosed light source unit comprises: a fixing plate having an opening portion; a light emitting device disposed in an opening portion of the fixing plate; and an optical lens disposed on the fixing plate, wherein the fixing plate has a plurality of fixing portions, the optical lens includes: a bottom surface on the fixing plate; a concave recess on the opening portion of the fixing plate; a light incident surface around the recess; and a light exit surface for emitting the light incident to the light incident surface, the fixing plate and the bottom surface of the optical lens are coupled to each other, and the fixing plate is spaced from the light emitting device.

20 Claims, 21 Drawing Sheets

(51) Int. Cl.
| | |
|---|---|
| *F21K 9/69* | (2016.01) |
| *H01L 33/58* | (2010.01) |
| *F21V 17/10* | (2006.01) |
| *H01L 33/48* | (2010.01) |
| *F21V 9/32* | (2018.01) |
| *H01L 25/13* | (2006.01) |
| *H01L 33/62* | (2010.01) |
| *H01L 25/075* | (2006.01) |
| *F21Y 115/10* | (2016.01) |
| *H01L 33/06* | (2010.01) |
| *H01L 33/12* | (2010.01) |
| *H01L 33/32* | (2010.01) |
| *H01L 33/40* | (2010.01) |
| *H01L 33/42* | (2010.01) |
| *H01L 33/46* | (2010.01) |

(52) U.S. Cl.
CPC .............. *F21V 17/10* (2013.01); *H01L 25/13* (2013.01); *H01L 33/483* (2013.01); *H01L 33/486* (2013.01); *H01L 33/505* (2013.01); *H01L 33/58* (2013.01); *F21Y 2115/10* (2016.08); *H01L 25/0753* (2013.01); *H01L 33/06* (2013.01); *H01L 33/12* (2013.01); *H01L 33/32* (2013.01); *H01L 33/405* (2013.01); *H01L 33/42* (2013.01); *H01L 33/46* (2013.01); *H01L 33/62* (2013.01); *H01L 2224/14* (2013.01)

(58) Field of Classification Search
USPC ............................................ 257/98; 362/293
See application file for complete search history.

(56) References Cited

U.S. PATENT DOCUMENTS

| | | | | |
|---|---|---|---|---|
| 2011/0114979 | A1* | 5/2011 | Jang | H01L 33/486 |
| | | | | 257/98 |
| 2012/0014115 | A1* | 1/2012 | Park | G02B 27/0955 |
| | | | | 362/311.02 |
| 2012/0099026 | A1* | 4/2012 | Yokota | G02B 19/0028 |
| | | | | 348/739 |
| 2013/0121000 | A1* | 5/2013 | Lee | H01L 33/56 |
| | | | | 362/293 |
| 2014/0239328 | A1* | 8/2014 | Lee | H01L 33/505 |
| | | | | 257/98 |
| 2015/0036353 | A1* | 2/2015 | Kim | F21V 19/002 |
| | | | | 362/311.02 |
| 2015/0049486 | A1 | 2/2015 | Jung et al. | |
| 2015/0055347 | A1* | 2/2015 | Kim | H01L 33/58 |
| | | | | 362/293 |
| 2016/0053965 | A1* | 2/2016 | Oh | H01L 33/60 |
| | | | | 362/336 |

FOREIGN PATENT DOCUMENTS

| | | |
|---|---|---|
| KR | 10-2010-0057340 | 5/2010 |
| KR | 10-2011-0057917 | 6/2011 |
| KR | 10-1236737 | 2/2013 |
| KR | 10-2013-0056339 | 5/2013 |
| KR | 10-2013-0104628 | 9/2013 |
| KR | 10-2015-0049669 | 5/2015 |
| KR | 10-2015-0024125 | 6/2015 |

\* cited by examiner

LIGHT SOURCE UNIT AND LIGHT UNIT HAVING SAME

CROSS-REFERENCE TO RELATED PATENT APPLICATIONS

This application is a U.S. National Stage Application under 35 U.S.C. § 371 of PCT Application No. PCT/KR2017/001309, filed Feb. 6, 2017, which claims priority to Korean Patent Application No. 10-2016-0014728, filed Feb. 5, 2016, whose entire disclosures are hereby incorporated by reference.

TECHNICAL FIELD

The present invention relates to a light source unit and a light unit having the same.

BACKGROUND ART

A light emitting device, for example, a light emitting diode (LED), is a type of a semiconductor device which converts electrical energy into light. The light emitting diode replaces an existing phosphor lamp, incandescent lamp, or the like and is considered as a next-generation light source.

Since the light emitting diode generates light by using a semiconductor device, the light emitting diode consumes very low power, as compared to an incandescent lamp which generates light by heating tungsten or a phosphor lamp which generates light by colliding ultraviolet rays generated through high pressure discharge with a phosphor.

Also, since the light emitting diode generates light by using a potential gap of the semiconductor element, the light emitting diode has a long lifespan, a fast response time, and environment-friendly characteristics, as compared to the existing light source.

Accordingly, much research has been conducted to replace the existing light source with a light emitting diode. The light emitting diode is increasingly used as a light source of a lighting apparatus such as various lamps used indoor and outdoor, a display device, an electronic board, a streetlamp, and the like.

DISCLOSURE

Technical Problem

An embodiment provides a light source unit having an optical lens.

The embodiment provides a light source unit having a fixing plate for supporting the optical lens around a light emitting device.

The embodiment provides a light source unit in which a light emitting device is disposed in an opening portion of a fixing plate and an incident surface of an optical lens is disposed on the opening portion.

An embodiment provides a light source unit having a coupling structure in which a fixing plate and an optical lens are coupled to each other.

An embodiment provides a light source unit including an optical lens having a concave incident surface and a convex light exit surface on an opening portion of a fixing plate.

The embodiment may provide a light source unit having a circuit board on which a plurality of fixing plates are arranged and a light unit having the same.

Technical Solution

The light source unit according to the embodiment includes: a fixing plate including an opening portion; a light emitting device disposed in an opening portion of the fixing plate; and an optical lens disposed on the fixing plate, wherein the fixing plate includes a plurality of fixed portions, wherein the optical lens includes a bottom surface on the fixing plate, a concave recess on the opening portion of the fixing plate, a light incident surface around of the light emitting device and a light exit surface for emitting light incident on the incident surface, further comprising an coupling means for mutually coupling the fixing plate and the bottom surface of the optical lens, wherein the fixing plate is spaced apart from a side surface of the light emitting device.

According to the embodiment, the coupling means may include a fixing groove disposed on the fixing plate, and a fixing protrusion coupled with the fixing groove on a bottom surface of the optical lens.

According to the embodiment, the fixing groove and the fixing protrusion have a circular or polygonal ring shape in the top view, and may be arranged continuously or discontinuously.

According to an embodiment, the fixing plate includes a body of a resin material, the fixing portion protrudes from the bottom of the body to different sides and including a metal material, and the plurality of fixing portions may be electrically insulated from the light emitting device.

According to the embodiment, the fixing plate includes a metal material, and the fixing plate includes a supporting portion disposed below the light source lens, and a plurality of leg portions bent from different sides of the supporting portion, and the fixing plate may be electrically insulated from the light emitting device.

According to the embodiment, the opening portion of the fixing plate may include a sidewall bent downward from the supporting portion, and an extending portion bent from the sidewall toward the light emitting device.

According to an embodiment, the bottom surface of the optical lens may comprise a flat first bottom portion facing the inner region of the top surface of the fixing plate, a inclined second bottom portion spaced apart from the outer region of the top surface of the fixing plate.

According to the embodiment, the top surface of the fixing plate may have an area equal to or larger than a bottom area of the light source lens, and the top surface of the light emitting device may be disposed higher than the top surface of the light emitting device.

According to an embodiment, further comprising a circuit board disposed below the fixing plate, wherein the circuit board has a plurality of lead electrodes disposed under the opening portion of the fixing plate and connected to the light emitting device, and a fixing pattern connected to the fixing portion of the fixing plate.

According to an embodiment, further comprising a phosphor film included between the light emitting device and the optical lens, and the fixing plate may have a stepped structure in which an outer portion of the phosphor film is disposed around an upper portion of the opening portion.

According to the embodiment, the optical lens has a step structure around a lower portion of the recess, and an outer side of the phosphor film is disposed between the fixing plate and the bottom surface of the optical lens and may be coupled to the step structure.

According to the embodiment, the fixing groove of the fixing plate is disposed around the opening, and the fixing protrusion of the optical lens may protrude downward the bottom surface of the light source lens around the recess.

According to the embodiment, the light emitting device includes a light emitting chip that emits light at least five surfaces, and a phosphor layer on the light emitting chip, and the exit surface of the optical lens has a first light exit surface and a second light exit surface between the exit surface and the bottom surface.

According to the embodiment, the optical lens may have two axes having different lengths passing through the center of the bottom surface.

Advantageous Effects

The embodiment may stably fix the optical lens.

The embodiment may lower the height of the optical lens.

The embodiment may easily align the light emitting devices since the light emitting devices are arranged on the circuit board and then inserted into the opening portion of the fixing plate.

Embodiments may provide a wide interval between light emitting devices, thereby reducing interference between optical lenses.

The embodiment may reduce a number of light emitting devices arranged in the light unit.

The embodiment may improve a reliability of the light source unit having the optical lens.

Embodiments may improve an image by minimizing interference between adjacent optical lenses.

The embodiment may improve a reliability of a light unit such as an optical lens.

Embodiments may improve the reliability of a lighting system having a light emitting module.

BEST MODE FOR CARRYING OUT THE INVENTION

The embodiments may be modified in other forms or various embodiments may be combined with each other, and the scope of the present invention is not limited to each embodiment described below.

Although a description in a particular embodiments is not described in another embodiments, the other embodiments may be understood as being related to the other embodiments unless otherwise described or contradicted by those in the other embodiments.

For example, if the features for configuration A are described in a particular embodiment and the features for configuration B are described in another embodiment, even if the embodiment in which configuration A and configuration B are combined is not explicitly described, It is to be understood that they fall within the scope of the invention.

Hereinafter, the embodiments will be apparently understood to those skilled in the art based on accompanying drawings and the description of the embodiments. In the description of the embodiments, it will be understood that, when a layer (film), a region, a pattern, or a structure is referred to as being "on" a substrate, another layer (film), another region, or another structure, it can be "directly" or "indirectly" on the other substrate, the other layer (film), the other region, or the other structure, or one or more intervening layers may also be present. Such a position of the layer has been described with reference to the drawings.

Hereinafter, a light source unit and a light unit having the same according to an embodiment will be described with reference to the accompanying drawings.

Figure 1:
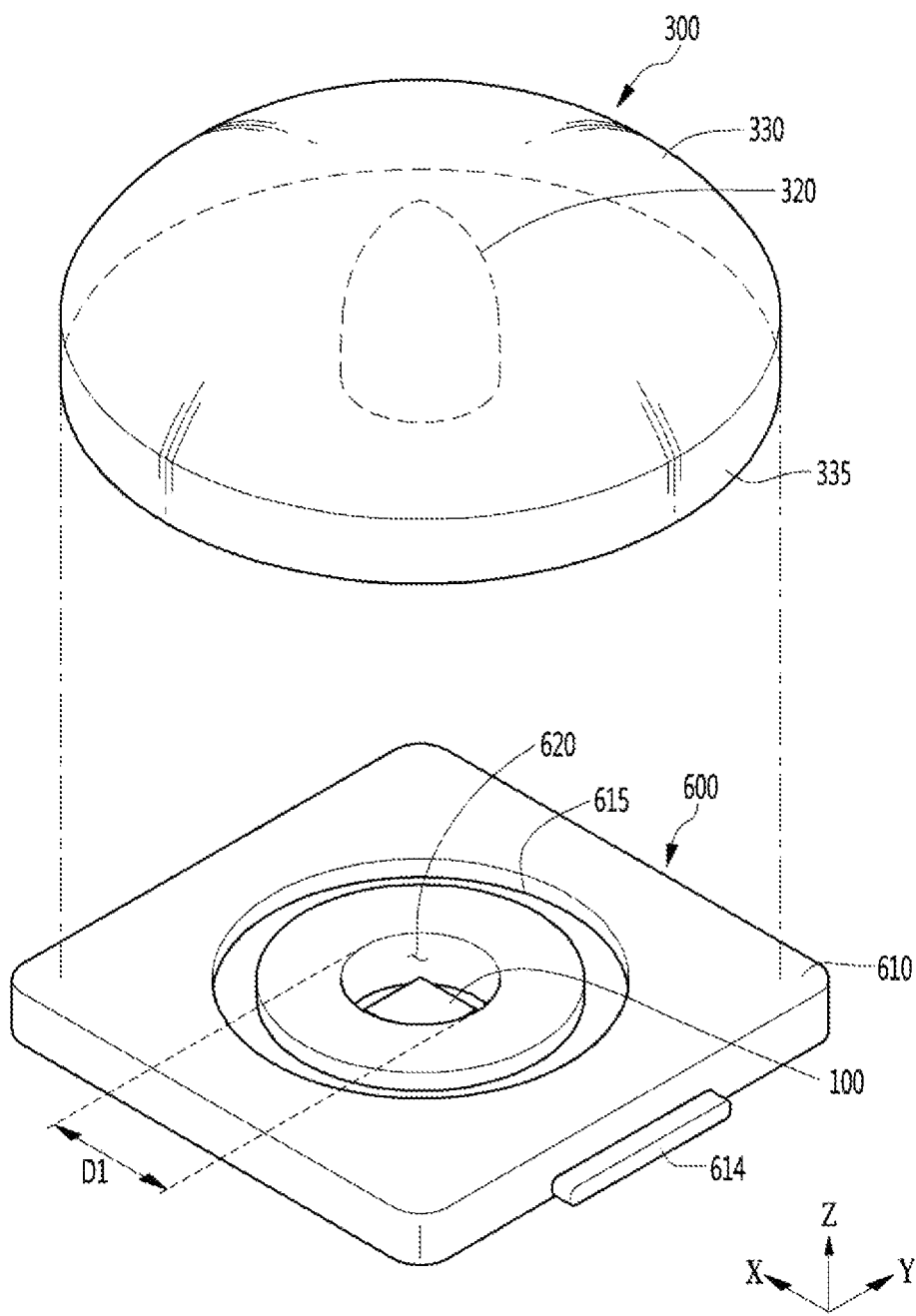
FIG. 1 is an exploded perspective view of a light source unit according to a first embodiment.
Figure 2:
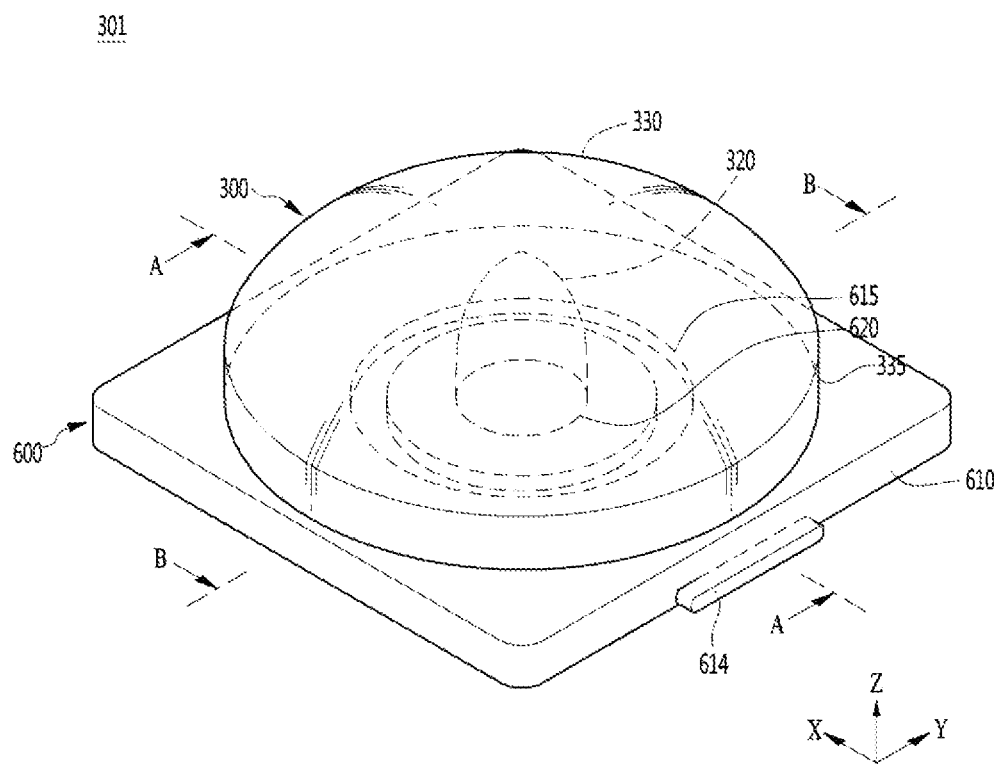
FIG. 2 is an assembled perspective view of the light source unit of FIG. 1.
Figure 3:
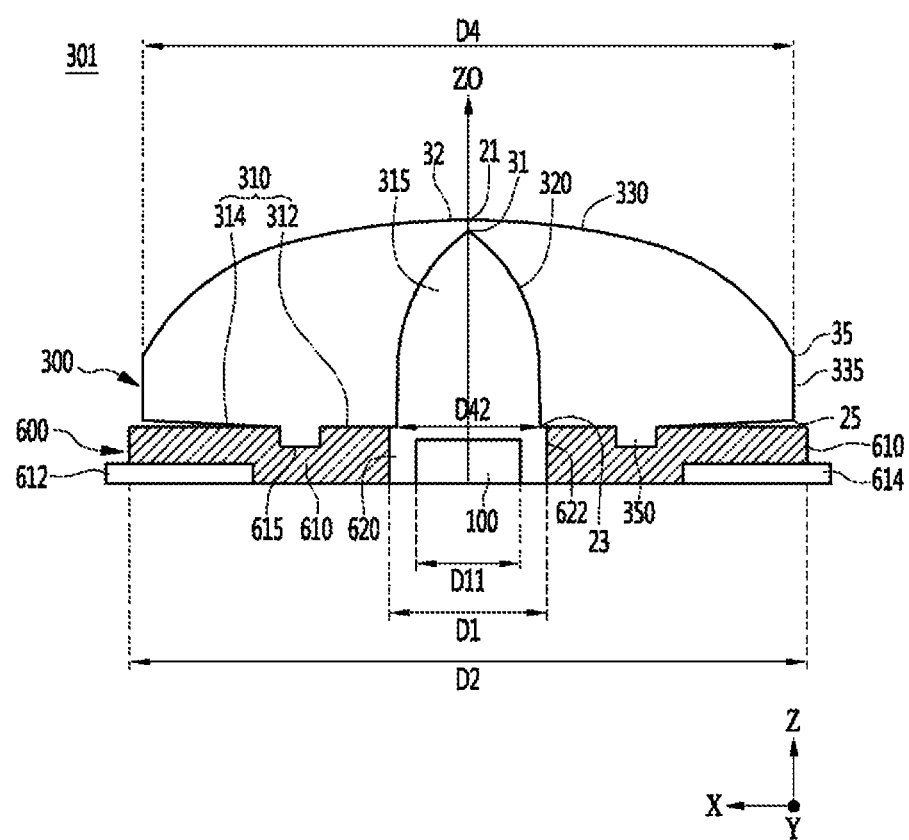
FIG. 3 is a side sectional view taken on A-A of the light source unit of FIG. 2.
Figure 4:
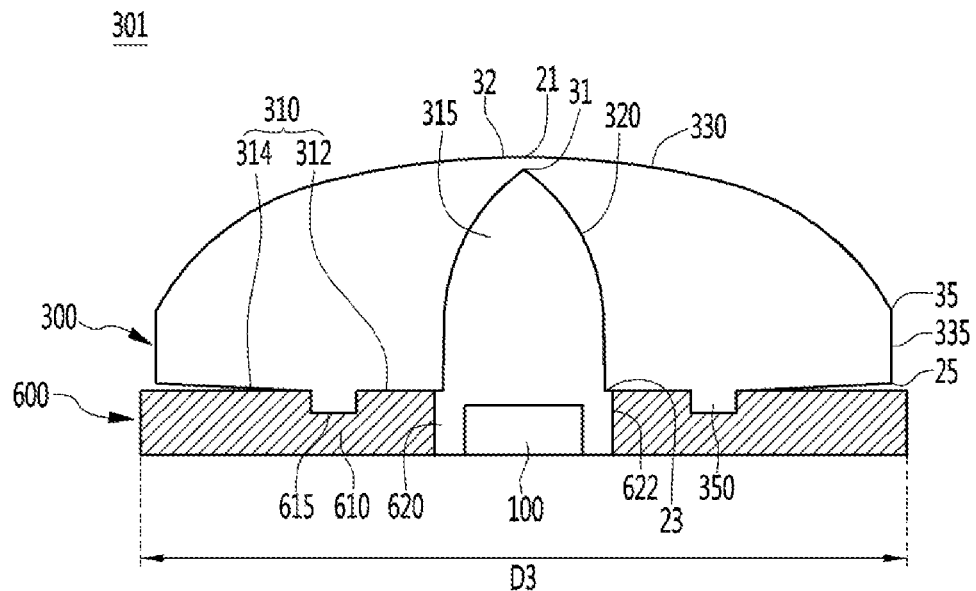
FIG. 4 is a side sectional view taken on B-B of the light source unit of FIG. 2.
Figure 4:
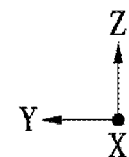
Figure 5:
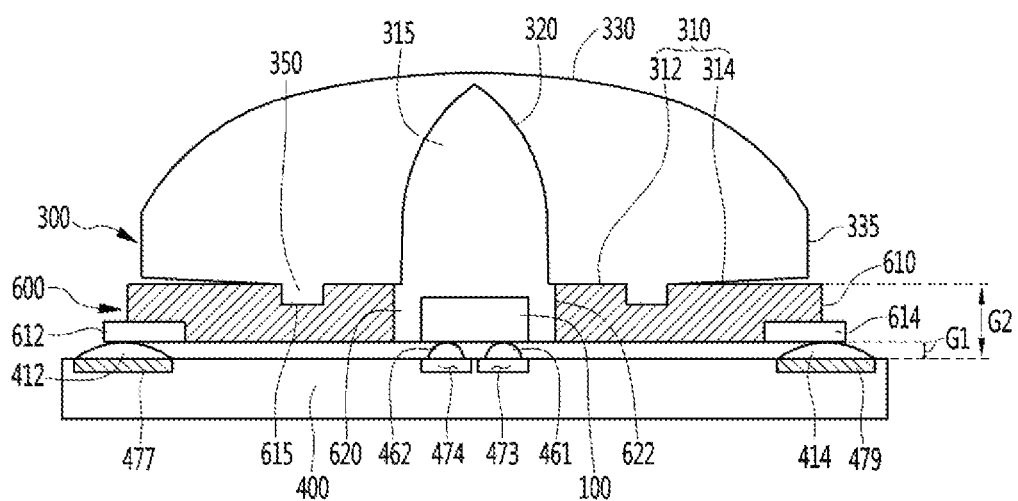
FIG. 5 is an example in which the fixing plate of FIG. 3 is disposed on a circuit board.
Figure 5:
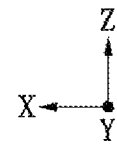
Figure 6:
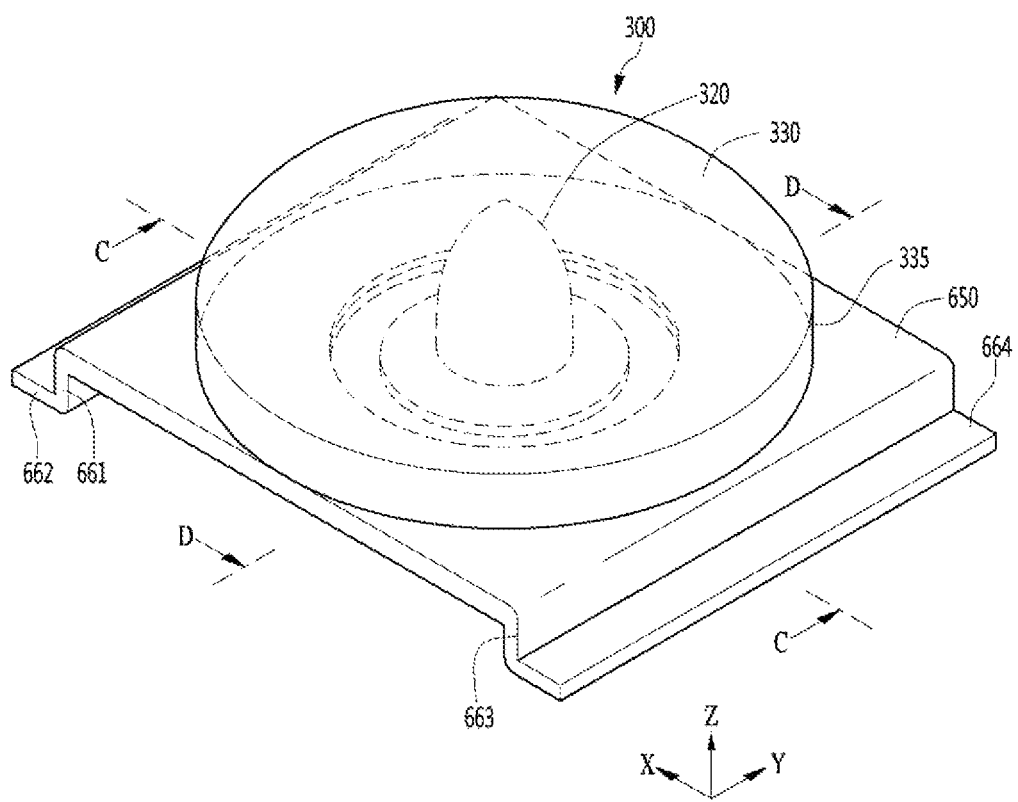
FIG. 6 is a perspective view of the light source unit according to the second embodiment.

FIG. 1 is an exploded perspective view of the light source unit according to the first embodiment, FIG. 2 is an assembled perspective view of the light source unit of FIG. 1, FIG. 3 is a side sectional view taken on A-A of the light source unit of FIG. 2, FIG. 4 is a side sectional view taken on B-B of the light source unit of FIG. 2, and FIG. 5 is an example in which the fixing plate of FIG. 3 is disposed on a circuit board.

Referring to FIGS. 1 to 4, a light source unit 301 includes a fixing plate 600 having an opening portion 620, a light emitting device 100 in an opening portion 620 of the fixing plate 600, and an optical lens 300 on the fixing plate 600.

The fixing plate 600 may include a body 610 and fixing portions 612 and 614 disposed outside the body 610. The body 610 of the fixing plate 600 may be provided in a plate shape having a predetermined thickness. The thickness of the fixing plate 600 may be in a range of 1 mm or less, for example, 0.9 mm to 0.6 mm. When the thickness of the fixing plate 600 is less than the above range, a handling of the fixing plate 600 is difficult and the light source unit 301 may not function as the plate, and if it is larger than the above range, the thickness of the light source unit 301 may be increased and the thickness of the light unit may be increased. The minimum thickness of the fixing plate 600 is larger than the thickness of the light emitting device 100 to protect the light emitting device 100 disposed in the fixing plate 600 and to guide the light emitted from the light emitting device 100 to the optical lens 300. The light emitting device 100 according to the embodiment may include a semiconductor light emitting device having a semiconductor device. The semiconductor device may be a semiconductor device such as a Zener diode, a FET, or a JFET.

As shown in FIGS. 4 and 5, the transverse length D2 and the longitudinal length D3 of the fixing plate 600 may be equal to or different from each other. Here, the transverse length D2 may be a length in a first axis X direction and the longitudinal length D3 may be a length in a second axis Y direction. The first axis direction and the second axis direction may be directions orthogonal to each other. The direction of the third axis Z may be a direction orthogonal to the direction of the first and second axes X and Y directions. The direction of the third axis Z direction may be a thickness direction or a perpendicular direction of the fixing plate 600. The transverse length D2 of the fixing plate 600 may be less than or equal to twice the transverse length of the optical lens 300, for example, in a range of 0.8 to 1.5 times. The longitudinal length D3 of the fixing plate 600 may be equal to or less than twice the longitudinal length of the optical lens 300, for example, in a range from 0.8 times to 1.5 times.

A top surface area of the fixing plate 600 may be wider than the bottom surface area of the optical lens 300. Since the top surface area of the fixing plate 600 is larger than the bottom surface area of the optical lens 300, the light leaked toward the bottom of the optical lens 300 may be effectively reflected.

An outer shape of the body 610 of the fixing plate 600 may be polygonal, circular or elliptical. The outer shape of the body 610 of the fixing plate 600 may be the same as or different from the outer shape of the optical lens 300. When the body 610 of the fixing plate 600 has a circular shape, the body has a circular shape with a diameter the same as a width D4 or a diameter of the optical lens 300 or a diameter equal to or less than twice the diameter of the optical lens 300. When the body 610 of the fixing plate 600 is polygonal, a length of at least one or both of the first axis X direction and the second axis Y direction of the body is less than or equal to twice the maximum width of the optical lens 300, for example, in a range of 0.8 times to 1.5 times. The fixing plate 600 having a diameter or length larger than the diameter D4 of the optical lens 300 may reflect incident light without loss.

The body 610 of the fixing plate 600 may include a reflective material or may have a metallic or non-metallic reflective layer. The material of the fixing plate 600 may include at least one of resin materials such as plastic, epoxy, and silicone. The fixing plate 600 may be formed of an insulating material and may not be in contact with or not be electrically connected to the light emitting device 100. The fixing plate 600 may be electrically insulated or separated from the light emitting device 100. A reflective layer of an insulating material may be formed on the surface of the fixing plate 600. A concave-convex structure or a rough structure may be disposed on the top surface of the fixing plate 600 to improve light reflection efficiency.

Referring to FIGS. 1, 3 and 4, the fixing plate 600 includes an opening portion 620, and the opening portion 620 may be disposed in the body 610. The opening portion 620 may be disposed in a center region of a region of the fixing plate 600. The center region may be a region where the center of the opening portion 620 includes a point of a half of the length of the fixing plate 600 in the X-axis direction and a point of a half of the length in the Y-axis direction. The center region may be a region spaced apart from the side surfaces of the fixing plate 600 by a length equal to or greater than ⅕ of the lengths D2 and D3.

The opening portion 620 may have a circular shape, a polygonal shape, or an elliptical shape. When the opening portion 620 has a circular shape, a diameter of the circular shape may be larger than the diagonal length of the light emitting device 100. An area of the opening portion 620 may be larger than a bottom area of the light emitting device 100. When the opening portion 620 has a polygonal shape, the opening portion 620 may be square or pentagonal, but the shape is not limited thereto. The opening portion 620 may have an empty region in a region excluding a region of the light emitting device 100. The opening portion 620 is opened in a vertical direction or an up/down direction. A bottom width D2 of the opening portion 620 may be equal to or greater than a bottom width D42 of the recess 315 of the optical lens 300. The bottom width D2 of the opening portion 620 may be wider than the bottom width D11 of the light emitting device 100 and may be 1.8 mm or less, for example, in a range of 1.6 mm to 1.2 mm. When the bottom width D2 of the opening portion 620 is larger than the above range, the amount of light incident on the recess 315 of the optical lens 300 may be reduced. When the bottom width D2 is smaller than the above range, a mounting of the light emitting device 100 may be difficult. When the opening portion 620 has a circular shape or a polygonal shape, the light emitted from the polygonal light emitting device 100 may be effectively reflected.

The bottom area of the opening portion 620 may be larger than the bottom area of the light emitting device 100. The light emitting device 100 may be inserted into the opening portion 620. The bottom of the light emitting device 100 may be disposed on the same horizontal plane as the bottom of the opening portion 620 or on another horizontal plane. The height of the opening portion 620 may be equal to the thickness of the fixing plate 600, for example, the thickness of the body 610. The opening portion 620 may be formed to have a depth penetrating the body 610 of the fixing plate 600. The height of the opening portion 620 may be greater than the thickness of the light emitting device 100. The light emitting device 100 may be inserted into the opening portion 620 and the light emitting device 100 may not be exposed or protruded to the upper side of the opening portion 620. The top surface of the fixing plate 600 may be disposed higher than the top surface of the light emitting device 100. Light emitted from the light emitting device 100 disposed in the opening portion 620 may not leak through a lateral direction of the fixing plate 600. The light emitted from the light emitting device 100 may not leak through the interface between the fixing plate 600 and the optical lens 300 because the light emitting device 100 is disposed in the opening portion 620.

A side wall 622 of the opening portion 620 may be disposed perpendicular or inclined with respect to a horizontal line on the bottom of the fixing plate 600. The bottom width D42 of the recess 315 of the optical lens 300 may be changed according to a structure in which the side wall 622 of the opening portion 620 is vertically or inclined. For example, when the side wall 622 of the opening portion 620 is inclined, the bottom width D42 of the recess 315 of the optical lens 300 may be larger. When the side wall 622 of the opening portion 620 is inclined, the inclined side wall 622 may effectively reflect the light emitted from the light emitting device 100 in the emitting direction. A reflective layer (not shown) of a metal material may be further disposed on the side wall 622 of the opening portion 620. The reflective layer may reduce light traveling into the body 610 and improve the reflection efficiency of light.

Referring to FIGS. 1 to 4, an optical lens 300 may be disposed on the fixing plate 600. The fixing plate 600 functions as a supporting member for supporting the optical lens 300. The fixing plate 600 and the optical lens 300 may have coupling means that may be coupled with each other. For example, in the coupling means, a fixing groove 615 is disposed in the body 610 of the fixing plate 600, and a fixing protrusion 350 coupled to the fixing groove 615 is formed in the optical lens 300. As another example, in the coupling means, when the fixing protrusion is disposed in the fixing plate 600, the optical lens 300 may be provided with a fixing groove coupled to the fixing protrusion.

The fixing groove 615 is concave on the upper portion of the fixing plate 600, for example, the upper portion of the body 610. The fixing groove 615 may be a circular ring shape or a polygonal or elliptic ring shape. The fixing groove 615 may be a continuous ring shape or a discontinuous ring shape. A fixing protrusion 350 protruding toward the bottom direction of the fixing plate 600 may be disposed on a lower portion of the optical lens 300. The fixing protrusion 350 is inserted into the fixing groove 615 and may be a circular ring shape, a polygonal shape, or an elliptical ring shape. The fixing protrusions 350 may be continuous or discontinuous ring-shaped. The fixing protrusion 350 of the optical lens 300 may be coupled to the fixing groove 615 of the fixing plate 600. The depth of the fixing groove 615 may be equal to or greater than the height of the fixing protrusion 350 of the optical lens 300 and the bottom surface of the optical lens 300 may be in contact with the top surface of the fixing plate 600. The depth of the fixing groove 615 may be ½ or less, for example, ⅓ or less of the thickness of the body 610. When the depth of the fixing groove 615 is ½ or more, the rigidity of the body 610 may be lowered. The depth of the fixing groove 615 may be in a range of 0.2 to 0.5 times the thickness of the body 610.

The width of the fixing groove 615 of the fixing plate 600 may be equal to or larger than the width of the fixing protrusion 350 of the optical lens 300. The fixing protrusion 350 of the optical lens 300 may be coupled to the fixing groove 615 of the fixing plate 600 in a forced fit manner. An adhesive (not shown) may be disposed in the fixing groove 615, and the fixing protrusion 350 may be adhered to the fixing groove 615 with the adhesive. The adhesive may be silicon or epoxy, but is not limited thereto.

As another example, a reflective or transparent adhesive may be disposed on a top surface of the fixing plate 600, for example, a top surface of the body, and the optical lens 300 may be adhered on the top surface of the body 610 of the fixing plate 600. In this case, the fixing means to the fixing plate 600 and the optical lens 300, for example, the fixing grooves 615 of the fixing plate 600 and the fixing protrusions 350 of the optical lens 300 may be removed from the fixing plate 600 and the optical lens 300.

An interval between the fixing grooves 615 spaced in the X axis direction or the Y axis direction in the fixing plate 600 is a maximum interval. For example, the diameter of the fixing groove 615 of a circular shape may be 3.0 mm or more, for example, in range of 3.2 mm to 4.2 mm. The optical lens 300 may be tilted when the interval between the fixing grooves 615 and the Y-axis direction is smaller than the above range. If the interval is larger than the above range, the bottom area of a second bottom of the optical lens 300 is reduced, and the optical loss may be increased. The maximum interval between the fixing grooves 615 in the X axis direction or the Y axis direction in the fixing plate 600 may be equal to or larger than the interval D43 between the fixing protrusions 350 of the optical lens 300 shown in FIG. 11 in the X axis direction or the Y axis direction.

The fixing plate 600 includes a plurality of fixing portions 612 and 614 and the plurality of fixing portions 612 and 614 may be disposed on opposite sides of the side surfaces of the fixing plate 600. The plurality of fixing portions 612 and 614 may be coupled to the outside of the fixing plate 600 and protrude further than the side surfaces of the fixing plate 600. The plurality of fixing portions 612 and 614 may be disposed on opposite sides of the fixing plate 600 or may be disposed on different sides. The plurality of fixing portions 612 and 614 may protrude from the side surface of the fixing plate 600. The plurality of fixing portions 612 and 614 may be closer to the bottom surface of the fixing plate 600 than the top surface of the fixing plate 600 or may be protruded toward an outer side from the bottom of the fixing plate 600. The lower surfaces of the plurality of fixing portions 612 and 614 may be disposed in the same horizontal plane as the bottom of the fixing plate 600. The thickness of the plurality of fixing portions 612 and 614 may be smaller than the thickness of the fixing plate 600 and may be 0.5 times or less, for example, in a range of 0.1 to 0.5 times the thickness of the fixing plate 600. The plurality of fixing portions 612 and 614 may be electrically insulated from the light emitting device 100. The plurality of fixing portions 612 and 614 and the fixing plate 600 may be physically separated from the light emitting device 100. The fixing plate 600 and the light emitting device 100 may be insulated from each other.

The plurality of fixing portions 612 and 614 include first and second fixing portions 612 and 614 and the first and second fixing portions 612 and 614 may be disposed on opposite sides of the side surfaces of the fixing plate 600. The plurality of fixing portions 612 and 614 may be formed of a different material from that of the body 610 of the fixing plate 600, for example, a metal material. The fixing portions 612 and 614 are formed of any one selected from Ag, Al, Au, Cr, Co, Cu, Fe, Hf, In, Mo, Ni, Si, Sn, Ta, and alloys thereof and may be formed as a single layer or multiple layers.

Each of the first and second fixing portions 612 and 614 may be disposed on each side of the fixing plate 600, but are not limited thereto. Each of the first and second fixing portions 612 and 614 may be protruded with a length less than ½ of the transverse length D2 of the fixing plate 600, but are not limited thereto. Each of the first and second fixing portions 612 and 614 may be 1 times or less, for example, in a range of 0.2 to 0.8 times the longitudinal length D3 of the fixing plate 600. If the fixing length may be larger than the above range, improvement of fixing force is insignificant, if it is smaller than the above range, the fixing force may be lowered and a fixing failure of the unit may occur. The plurality of fixing portions 612 and 614 may be disposed on at least one side or at least two sides of the fixing plate 600 so that the fixing plate 600 may be fixed to a fixing member such as a printed circuit board.

Figure 11:
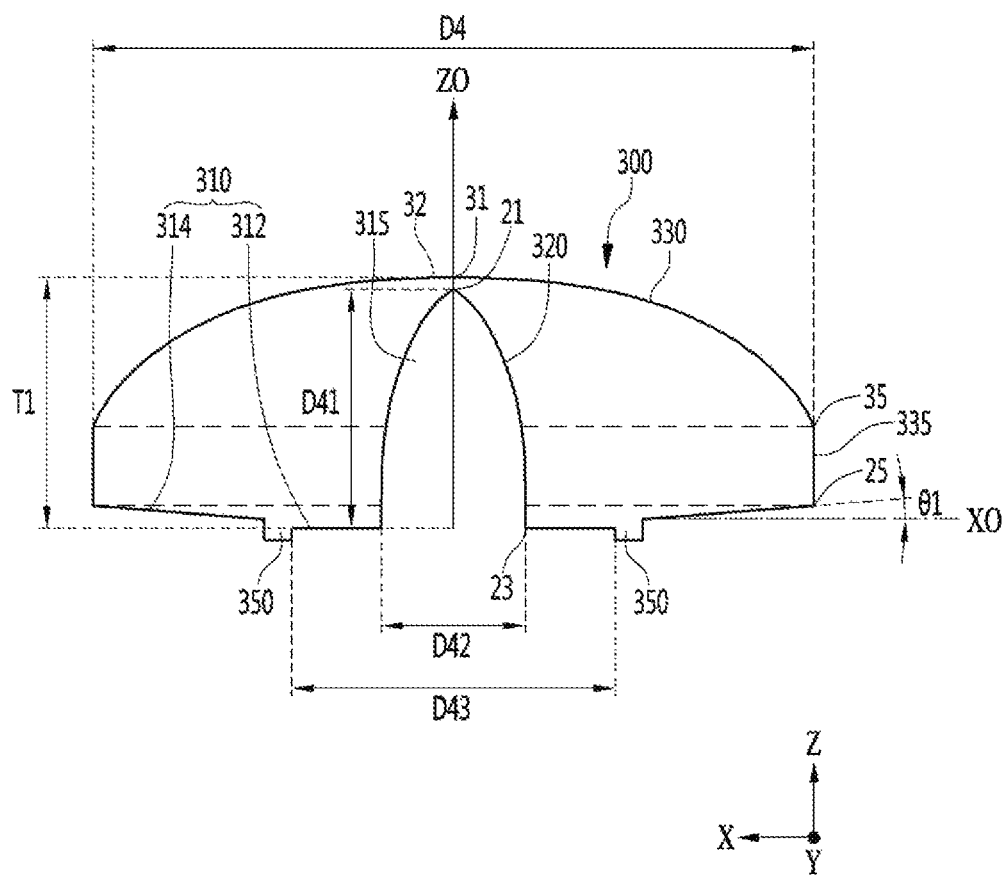
FIG. 11 is a view showing an example of an optical lens of the light source unit according to the embodiment.

As shown in FIGS. 3, 4 and 11, the optical lens 300 may be disposed on the fixing plate 600. The optical lens 300 includes a bottom surface 310 and a recess 315 convex upwardly from the bottom surface 310 in a center region of the bottom surface 310, and an exit surfaces 330 and 335 for emitting light incident through the incident surface 320.

The exit surfaces 330 and 335 of the optical lens 300 may include one or a plurality of light exit surfaces and may include a first light exit surface 310 disposed on the opposite side of the bottom face 310 and the incident surface 320, and a second light exit surface 335 disposed on a lower part of the first light exit surface 330.

The axial direction of the optical lens 300 perpendicular to the bottom center of the recess 315 may be defined as a central axis Z0 or an optical axis. A horizontal axis direction with respect to the bottom center of the recess 315 may be a first axis X direction and the first axis X direction may be a direction orthogonal to the central axis Z0 or the optical axis. The bottom center of the recess 315 may be the bottom center of the optical lens 300 and may be defined as a reference point. The central axis Z0 may be defined as an optical axis when aligned with a vertical axis, e.g., an optical axis, with respect to the top surface of the light emitting device 100. The optical axis and the central axis may have an alignment error between the light emitting device 100 and the optical lens 300.

The optical lens 300 may include a light-transmitting material. The optical lens 300 may include at least one of polycarbonate (PC), Polymethyl methacrylate (PMMA), silicon or epoxy resin, or glass. The optical lens 300 may include a transparent material having a refractive index ranging from 1.4 to 1.7.

Referring to FIG. 11, the bottom surface 310 of the optical lens 300 according to the embodiment may be disposed around the recess 315. The bottom surface 310 may include inclined surfaces with respect to a horizontal straight line X0, include curved surfaces, or may include inclined surfaces and curved surfaces. The recess 315 has a shape recessed in the vertical direction from the center area of the bottom surface 310.

The bottom surface 310 of the optical lens 300 includes a first edge 23 adjacent to the recess 315 and a second edge 25 adjacent to the second light exit surface 335. The first edge 23 is a boundary region between the incident surface 320 and the bottom surface 310 and may include a low point region of the optical lens 300. The first edge 23 may include the lowest point of the region of the bottom surface 310. The position of the first edge 23 may be positioned lower than the position of the second edge 25 with respect to the horizontal straight line X0. The first edge 23 may cover the lower periphery of the incident surface 320. The second edge 25 may be an outer region of the bottom surface 310 or a lower region of the second light exit surface 335. The second edge 25 may be a boundary region between the bottom surface 310 and the second light exit surface 335.

The first edge 23 may be an inner region of the bottom surface 310 or a boundary line with the incident surface 320. The second edge 25 may be an outer region of the bottom surface 310 or a boundary line with the second light exit surface 335. The first edge 23 may include an inner edge or a curved surface. The second edge 25 may include an outer edge or a curved surface. The first edge 23 and the second edge 25 may be opposite ends of the bottom surface 310. The first edge 23 may have a bottom view shape of a circular shape or an elliptical shape, and the second edge 25 may have a bottom view shape of a circular shape or an elliptical shape.

An interval between the bottom surface 310 of the optical lens 300 and the horizontal straight line X0 may be gradually narrowed toward the first edge 23. The Interval between the bottom surface 310 and the horizontal straight line X0 becomes gradually larger as the distance from the first edge 23 increases. The interval between the second edge 25 and the horizontal line X0 on the bottom surface 310 may be the maximum and the interval between the first edge 23 and the horizontal line X0 may be the minimum. The bottom surface 310 may include an inclined surface or a curved surface between the first edge 23 and the second edge 25, or may include both inclined surfaces and curved surfaces. The outer region of the bottom surface 310 may be gradually farther away from the horizontal straight line X0 toward the outer side and may be a total reflection surface when viewed from the recess 315. The bottom surface 310 may provide a sloped surface. Since the bottom surface 310 reflects light incident through the recess 315, the loss of light may be reduced.

The area of the bottom surface 310 may be increased since the bottom surface 310 is lowered closer to the first edge 23 of the recess 315. The area of the incident surface 320 of the recess 315 may be wider as the bottom surface 310 is lowered. The depth (D41 in FIG. 11) of the recess 315 becomes the height from the first edge 23, so that it may be deeper. By increasing the area of the bottom surface 310, the reflection area may be increased. The bottom of the recess 315 becomes lower, so that the bottom area may be increased.

The first edge 23 of the bottom surface 310 is disposed on the straight line X0 that is horizontal to the bottom of the recess 315 and the second edge 25 is spaced apart from the horizontal straight line X0 at a predetermined interval.

The interval between the second edge 25 and the horizontal straight line X0 may be 500 μm or less, for example, 450 μm or less. The interval between the second edge 25 and the horizontal straight line X0 may be in the range of 200 μm to 450 μm. If the interval is smaller than the above range, an interference problem may occur in the light emitted to the second light exit surface 335 because a low point position of the second light exit surface 335 is lowered. If the light exit surface 335 is larger than the above range, a problem arises that a curvature of a first light exit surface 330 may be changed and the thickness T1 of the optical lens 300 may be increased because a high point position of the second light exit surface 335 may become high.

The bottom surface 310 of the optical lens 300 may be inclined, for example, at a region of 50% or more. The bottom surface 310 of the optical lens 300 includes a first bottom portion 312 and a second bottom portion 314. The first bottom portion 312 may be disposed between the recess 315 and the second bottom portion 314. The first bottom portion 312 may be disposed inside the fixing protrusion 350 of the optical lens 300. The second bottom portion 314 may be disposed outside the fixing protrusion 350 of the optical lens 300. The first bottom portion 312 may be disposed in a flat surface and the second bottom portion 314 may be disposed in an inclined surface at an angle θ1 of 5 degrees or less from a horizontal straight line X0. The flat first bottom portion 312 may face or contact the inside of the top surface of the fixing plate 600 and the inclined second bottom portion 314 may be spaced apart from the top surface of the fixing plate 600. The interval between the second bottom portion 314 and the top surface of the fixing plate 600 may be gradually increased as the second bottom portion 314 is adjacent to the second light exit surface 335 of the optical lens 300. The first bottom portion 312 may stably position the optical lens 300 together the fixing protrusions 350 on the fixing plate 600 and the second bottom portion 314 may reflected the incident light.

For example, the bottom surface 310 of the optical lens 300 may be formed as a curved surface having a Bezier curve. The curve of the bottom surface 310 may be implemented as a spline, such as a cubic, a B-spline, or a T-spline. The curve of the bottom surface 310 may be implemented as a Bezier curve.

The bottom surface 310 of the optical lens 300 may include the fixing protrusion 350. The fixing protrusion 350 protrudes downward from the bottom surface 310 of the optical lens 300 and fixes the optical lens 300 to the fixing plate 600. The fixing protrusion 350 may be disposed around the lower portion of the recess 315.

The bottom shape of the recess 315 may include a circular shape. As another example, the bottom shape of the recess 315 may be an elliptical shape or a polygonal shape. The recess 315 may include a bell shape, a shell shape, or an elliptical shape in cross-section. The recess 315 may have a shape in which a width gradually becomes narrower upward. The recess 315 may have a shape gradually converging from the first edge 23 around the bottom toward the first vertex 21 at the top. If the bottom view of the recess 315 is circular, the diameter of the recess may be gradually reduced toward the first vertex 21. The recess 315 may be provided in a rotationally symmetrical shape with respect to the central axis Z0. The first vertex 21 of the incident surface 320 may be provided in a dot shape.

Referring to FIGS. 3 and 11, the bottom width D42 of the recess 315 of the optical lens 300 may be equal to or less than the width of the opening portion 620 of the fixing plate 600. The bottom width D42 of the recess 315 is equal to or smaller than the width of the opening portion 620 of the fixing plate 600, so that the light emitted through the opening portion 620 may effectively proceed to the recess 315. When the bottom width D42 of the recess 315 is larger than the width D1 of the opening portion 620 of the fixing plate 600, the light incident on the first edge 23 of the recess 315 may be reduced. As another example, the bottom width D42 of the recess 315 may be equal to or greater than the width of the opening portion 620 of the fixing plate 600, in this case, an efficiency of the light emitted through the opening portion 620 and transferred by the recess 315 of the optical lens 300 may be improved.

The bottom width D42 or the bottom area of the recess 315 may be larger than the width D11 or the bottom area of the light emitting device 100. The bottom area of the recess 315 may be equal to or less than the bottom area of the opening portion 620 of the fixing plate 600, but are not limited thereto.

The incident surface 320 of the optical lens 300 has a curved surface convex upward from the center area of the bottom surface 310 and may be a circumferential surface or an inner surface of the recess 315. The incident surface 320 may gradually farther away as a distance to the bottom center of the recess 315 is vertically increased. Since the incident surface 320 is provided with a convex curved surface, the light may be refracted in the entire area. The incident surface 320 may be formed of a rotating body having a Bezier curve. The curve of the incident surface 320 may be realized by a spline, such as cubic, B-spline, or T-spline. The curve of the incident surface 320 may be realized by a Bezier curve.

The optical lens 300 includes a first light exit surface 330 and a second light exit surface 335. The first light exit surface 330 may be the opposite side of the incident surface 320 and the bottom surface 310 with respect to the lens body. The first light exit surface 330 includes a curved surface. The first light exit surface 330 may have a second vertex 31 corresponding to the center axis Z0 and the second vertex 31 may be a vertex of the lens body. The first light exit surface 330 may include a convex curved surface. The first light exit surface 330 may be formed as a curved surface having a curvature, for example, a curvature having a different positive curvature. The first light exit surface 330 may have an axisymmetric shape, for example, a rotationally symmetrical shape with respect to the central axis Z0. A region between the second vertex 31 and the second light exit surface 335 on the second light exit surface 335 may not have a negative curvature. The region between the second vertex 31 and the second light exit surface 335 on the second light exit surface 335 may have a different positive radius of curvature.

The first light exit surface 330 may become gradually larger as the distance from the center of the bottom of the recess 315 is gradually farther away from the central axis Z0. The center region 32 of the first light exit surface 330 may have a gently convex curve or a straight line. The center region 32 of the first light exit surface 330 may include a region vertically overlapping the recess 315. The center region 32 of the first light exit surface 330 may include a region vertically overlapping the opening portion 620 of the fixing plate 600.

The radius of curvature of the center region 32 of the first light exit surface 330 may be greater than the radius of curvature of the incident surface 320. The slope of the first light exit surface 330 may be less than the slope of the incident surface 320. The first light exit surface 330 of the optical lens 300 increases in forging as the distance from the central axis Z0 is increased in the orientation angle and the second light exit surface 335 includes a region outside an orientation angle distribution of light and the forging of the second light exit surface 335 is the same or decreases as the distance increases with reference to the central axis Z0.

In the boundary region between the first light exit surface 330 and the second light exit surface 335, an angle at which the light is refracted may be reduced, for example, in a range of 2 degrees or less. This is because a surface of the first light exit surface 330 closer to the second light exit surface 335 may be provided as a tangent line or a perpendicular plane, so that the angle at which the light is refracted may be gradually reduced.

The second light exit surface 335 of the optical lens 300 may be disposed higher than the horizontal straight line X0 on the bottom surface of the recess 315. The second light exit surface 335 may be a flat surface or an inclined surface, and may be defined as a flange, but are not limited thereto.

The second light exit surface 335 may be disposed perpendicular or inclined with respect to a horizontal straight line X0. The second light exit surface 335 may extend vertically or obliquely from the outline of the first light exit surface 330. The second light exit surface 335 includes a third edge 35 adjacent to the first light exit surface 330 and the third edge 35 may be located at the same position as the outline line 330 of the first light exit surface 330 or may be located inside or outside the outline line of the first light exit surface 330.

Referring to FIG. 11, the width D4 of the optical lens 300 may be greater than the thickness T1. The width D4 may be equal to the length when the optical lens 300 is circular. The width D4 may be two times or more, for example, 2.5 times or more the thickness T1. The width D4 of the optical lens 300 may be in a range of 6 mm or more, for example, 7 mm to 15 mm. Since the width D4 of the optical lens 300 is greater than the thickness T1, the optical lens provides a uniform luminance distribution over the entire area of the illumination device and the light unit. Further, since the region covered by the light unit is improved, the number of optical lenses may be reduced, and the thickness of the optical lens may be reduced. The thickness T1 of the optical lens 300 may be in a range of 3 mm or less, for example, 2.5 mm to 3 mm. When the thickness T1 of the optical lens 300 is greater than the above range, a thickness of the light source unit may be increased, and when the thickness T1 is smaller than the above range, the optical lens may be difficult to manufacture.

The depth D41 of the recess 315 has an interval from the center of the bottom of the recess 315 to the first vertex 21. Here, the first vertex 21 may be the apex of the incident surface 320 or the upper end of the recess 315. The depth D41 of the recess 315 may have a depth of 75% or more, for example, 80% or more of the thickness T1 of the optical lens 300. The depth D41 of the recess 315 may be 80% or more of the distance between the second vertex 31 of the first light exit surface 330 and the bottom center of the recess 315 or the first edge 23. Even if the center region 32 of the first light exit surface 330 does not have a total reflective surface or a negative curvature because the depth D41 of the recess 315 is deep, the light can be diffused in a lateral direction even in a periphery region of the first vertex 21 of the incident surface 320. Since the recess 315 has a deep depth D41, the incident surface 320 may reflect light incident on the peripheral region of the first vertex 21 in a region close to the second vertex 31.

The minimum distance (=T1−D41) between the recess 315 and the first light exit surface 330 is an interval between the first vertex 21 of the incident surface 320 and the second vertex 31 of the first light exit surface 330. Since the minimum distance between the recess 315 and the first light exit surface 330 is reduced so that even if the center region 32 of the second light exit surface 335 does not have a full reflection surface or a negative curvature, a path of light on the center region may be diffused outwardly. This is because the first vertex 21 of the incident surface 320 is adjacent to the convex second vertex 31 of the first light exit surface 330 and the light amount of the light traveling in the lateral direction of the first light exit surface 330 through the incident surface 320 may be increased. Therefore, the amount of light diffused in the lateral direction of the optical lens 300 may be increased.

The first vertex 21 of the incident surface 320 may be disposed closer to the second vertex 31 which is the center of the first light exit surface 330, than to a straight line extending horizontally from the third edge 35 of the second light exit surface 335.

The width (vertical height) of the second light exit surface 335 may be less than the depth D41 of the recess 315 as a straight line distance between the second edge 25 and the third edge 35. The width of the second light exit surface 335 may be 0.3 times or more, for example, in a range of 0.32 to 0.6 times the depth D41, or may be 0.25 times or more of the thickness T1 of the optical lens 300, for example, in a range of 0.3 to 0.5 times. If the width of the second light exit surface 335 exceeds the above range, the amount of light emitted to the second light exit surface 335 is increased to make it difficult to control the light distribution. If the width is smaller than the above range, it may be difficult to secure a gate region in manufacturing.

The optical lens 300 according to an embodiment of the invention may include a side protrusion (Not shown) and the side protrusion may be protruded to an outer side than the second light exit surface 335 on a part of the second light exit surface 335.

The second light exit surface 335 of the optical lens 300 is disposed on the lower periphery of the first light exit surface 330 and the bottom surface 310 is located at a lower position than the second edge of the second light exit surface 335, (25). The bottom surface 310 may protrude below the horizontal line of the second edge 25 of the second light exit surface 335.

As another example of the optical lens 300, the second light exit surface 335 may have an uneven surface. The uneven surface may be formed as a rough haze surface. The uneven surface may be a surface on which scattering particles are formed. As another example of the optical lens 300, the bottom surface 310 may have an uneven surface. The uneven surface of the bottom surface 310 may be formed as a rough haze surface, or scattering particles may be formed.

The luminance distribution of the optical lens according to the haze may improve the light uniformity when the haze is processed on the bottom surface and the side surface of the optical lens 300 as compared with the case where the haze is not processed. Thus, the color difference change in the haze-processed optical lens 300 may be improved.

The optical lens 300 may change the path of the light emitted from the light emitting device 100 and then extract the light. The light emitting device 100 may be defined as a light source. The optical lens 300 receives the light emitted from the light emitting device 100 through the incident surface 320 and emits the light to the first and second light output surfaces 330 and 335. Some light incident from the incident surface 320 may be reflected by the bottom surface 310 through a predetermined path and emitted to the first or second light exit surface 330 or 335.

The light emitting device 100 according to the embodiment may include at least one of an LED chip having a compound semiconductor such as an ultraviolet (UV) LED chip, a blue LED chip, a green LED chip, a white LED chip, and a red LED chip. The light emitting device 100 may include at least one or both of Group II-VI compound semiconductors and Group III-V compound semiconductors. The light emitting device 100 may emit at least one of blue, green, blue, UV, and white light. The light emitting device 100 may emit, for example, white light. The light emitting device 100 may include a light emitting chip and a phosphor film on the light emitting chip. The phosphor film may include at least one or two or more of blue, cyan, green, and red phosphors.

The light emitting device 100 may provide five or more light emitting surfaces. Here, the light emitting surface having five or more light emitting surfaces may include the top surface and four or more lateral surfaces of the light emitting device 100.

Referring to FIG. 5, the light source unit includes a circuit board 400 disposed under the fixing plate 600. One or a plurality of the light emitting devices 100 may be arranged on the circuit board 400 at a predetermined interval. The light emitting device 100 is disposed between the optical lens 300 and the circuit board 400 and receives power from the circuit board 400 to emit light. The light source unit may include a light emitting module having a fixing plate 600 and a light emitting device 100 on a circuit board 400.

The fixing plate 600 may be disposed between the circuit board 400 and the optical lens 300. The circuit board 400 may have a length greater than at least one or both of a transverse length (D2 of FIG. 3) of the fixing plate 600 and a longitudinal length (D3 of FIG. 3). One or a plurality of the fixing plates 600 may be disposed on the circuit board 400. The plurality of fixing plates 600 may be arranged in one or more rows.

The fixing plate 600 may be spaced apart from the circuit board 400 by a predetermined gap G1. That is, the fixing plate 600 may not contact the top surface of the circuit board

400. The optical lens 300 may be spaced apart from the circuit board 400 by an interval G2 greater than the thickness of the fixing plate 600.

The circuit board 400 may include a circuit layer electrically connected to the light emitting device 100. The light emitting device 100 may be connected to a lead electrodes 473 and 474 of the circuit board 400 through adhesive members 461 and 462. The adhesive members 461 and 462 are electrically conductive materials and may include solder. The lead electrodes 473 and 474 of the circuit board 400 may be disposed under the opening portion 620 of the fixing plate 600.

The fixing plate 600 may not be electrically connected to the circuit board 400. The first and second fixing portions 612 and 614 of the fixing plate 600 may be connected to the circuit board 400 and fixed to the fixing patterns 477 and 479 of the circuit board 400 by adhesive members 412 and 414. The adhesive members 412 and 414 may include a material such as solder. The fixed patterns 477 and 479 may be disposed at positions corresponding to the first and second fixing portions 612 and 614 of the fixing plate 600 and may be electrically insulated from the lead electrodes 473 and 474.

The circuit board 400 may include at least one of a resin-based PCB, a metal core PCB (MCPCB) having a metal core, and a flexible PCB (FPCB), but are not limited thereto.

FIGS. 6 to 10 are views showing the light source unit according to the second embodiment.

Referring to FIGS. 6 to 10, the light source unit may include a light emitting device 100, a fixing plate 650, and an optical lens 300.

The fixing plate 650 may be formed of a metal plate. The metal material may be one selected from Ag, Al, Au, Cr, Co, Cu, Fe, Hf, In, Mo, Ni, Si, Sn, Ta, Ti, W and a selective alloys thereof. The fixing plate 650 may be formed as a single layer or multiple layers.

Figure 7:
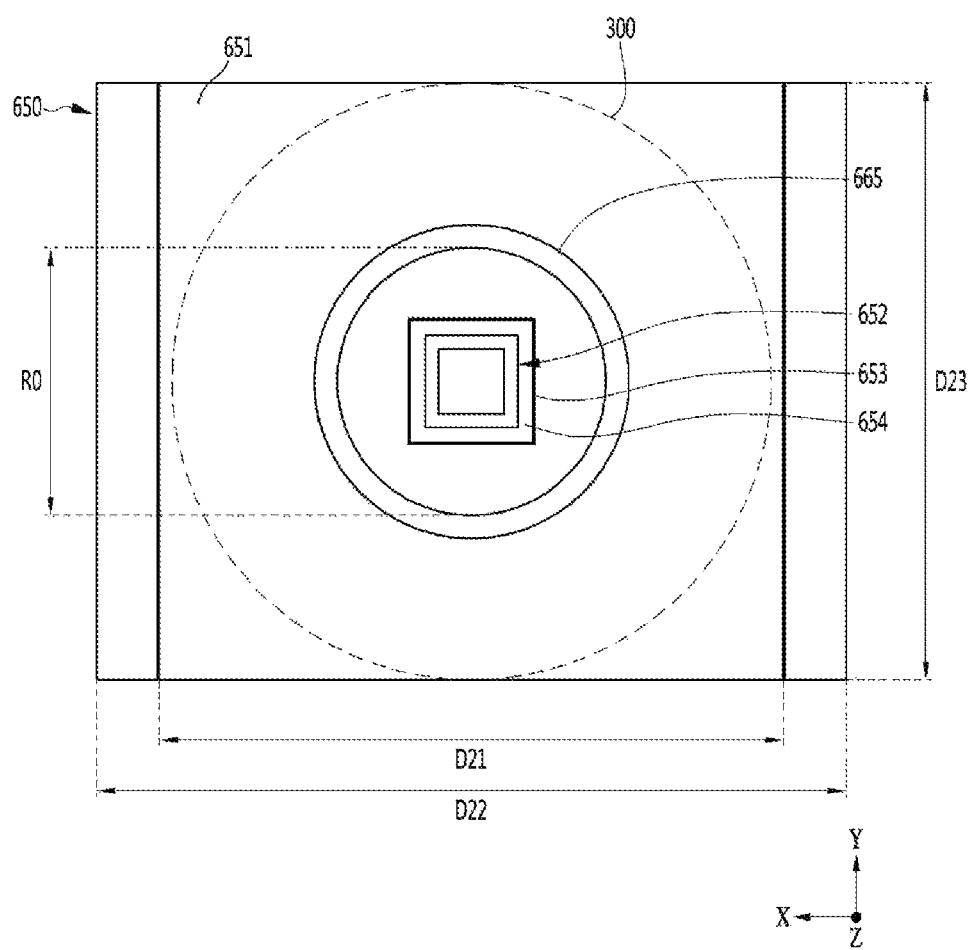
FIG. 7 is a perspective view showing the fixing plate in the light source unit of FIG. 6.

Referring to FIG. 7, the transverse length D22 of the fixing plate 650 may be the same as or different from the longitudinal length D23, and may be, for example, 6 mm or more, for example, 6.5 mm or more. The width D21 of the support portion 650 of the fixing plate 650 is equal to or larger than the width of the optical lens 300, for example, a diameter of the circular shape, so that leakage of light may be prevented.

Figure 8:
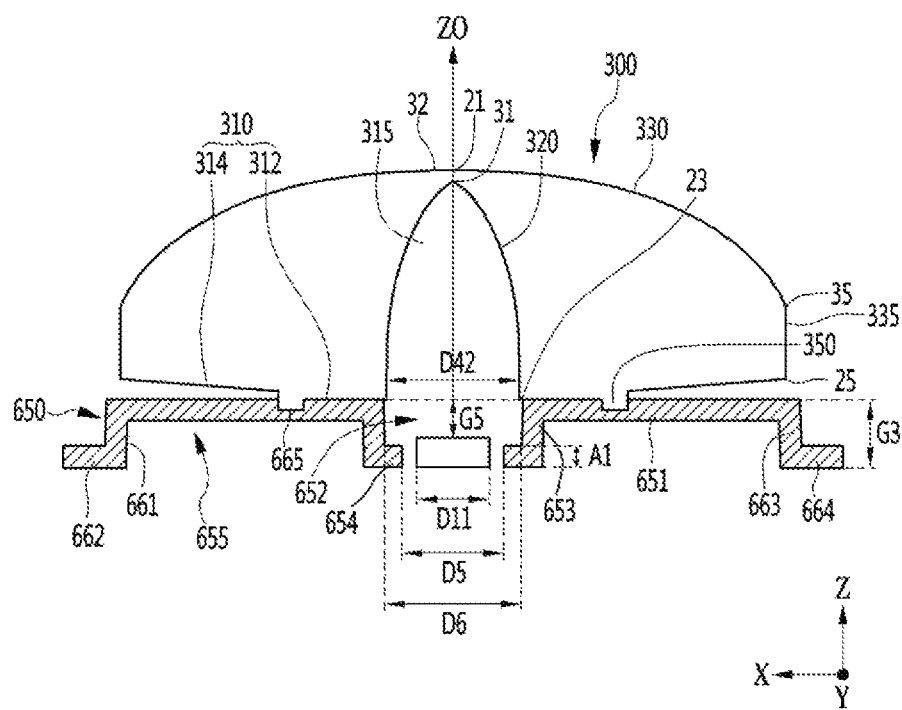
FIG. 8 is a side sectional view taken on C-C of the light source unit of FIG. 6.
Figure 9:
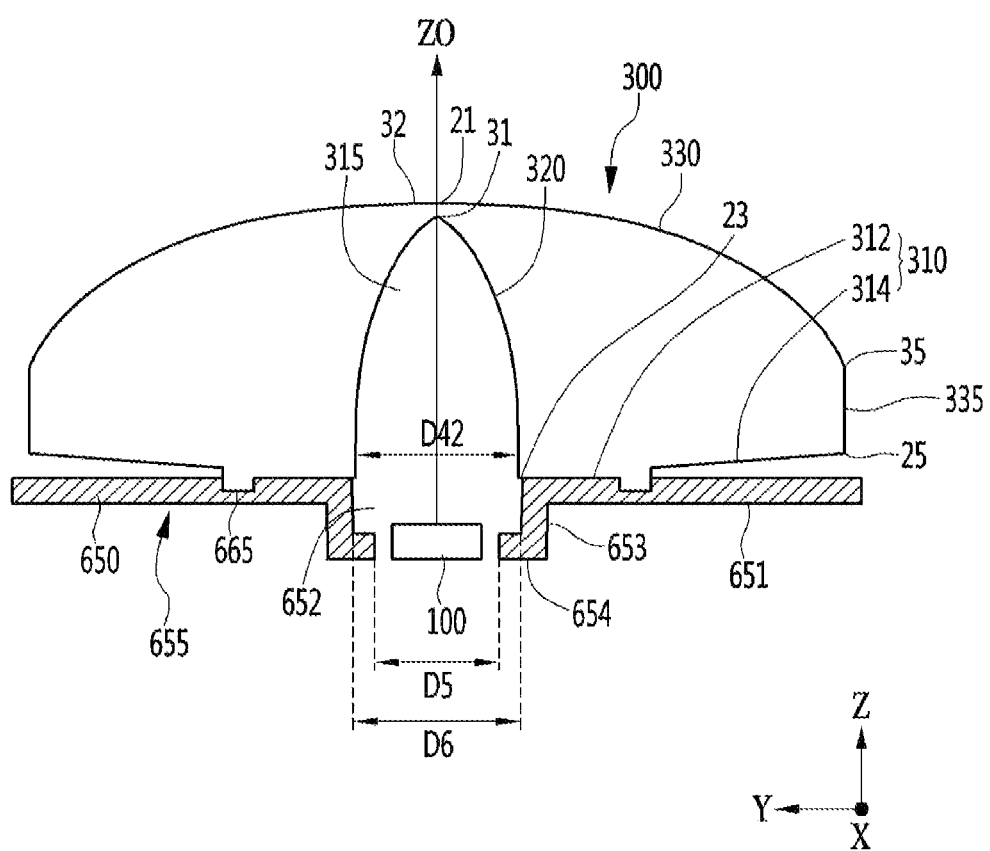
FIG. 9 is a side sectional view taken on D-D of the light source unit of FIG. 6.

Referring to FIGS. 8 and 9, the fixing plate 650 includes an opening portion 652. The opening portion 652 may have a lower width D5 that is narrower than the upper width D6. An area of the bottom surface of the opening portion 652 may be narrower than the top surface area. The height of the opening portion 652 may be greater than the thickness A1 of the fixing plate 650. The thickness (for example, A1) of the fixing plate 650 may be 0.35 mm or less, for example, in a range of 0.2 mm to 0.3 mm. When the thickness A1 of the fixing plate 650 is thicker than the above range, a material waste of the fixing plate may be large, and when the thickness is smaller than the above range, the function as a support member may be weakened.

The fixing plate 650 may be physically spaced apart from the light emitting device 100. The fixing plate 650 may be disposed to be electrically separated from the light emitting device 100. The fixing plate 650 is disposed around the light emitting device 100 to reflect the light emitted from the light emitting device 100 and to protect the light emitting device 100 and to support the optical lens 300.

A top surface area of the support portion 651 of the fixing plate 650 may be larger than a bottom surface area of the optical lens 300 to prevent leakage of light traveling from the optical lens 300 to the top surface of the fixing plate 650.

The opening portion 652 of the fixing plate 650 includes a sidewall 653 bent from the supporting portion 651 and an extending portion 654 bent from the sidewall 653. The extending portion 654 is bent in a downward direction or a vertical direction from the supporting portion 651 of the fixing plate 650 and the extending portion 654 protrudes from the side wall 653 to a direction of the light emitting device 100 or the center direction of the opening portion 652, that is, in a horizontal direction.

A shape of top view of the opening portion 652 may have a polygonal, for example, a rectangular shape. The shape of the top view of the opening portion 652 may be the same as the shape of the light emitting device 100. The shape of the top view of the opening portion 652 may be another shape such as a circular shape or an elliptical shape, but is not limited thereto. The upper and lower portions of the opening portion 652 are open structure.

The shape of bottom view of the opening portion 652 may be polygonal, for example, rectangular. The opening portion 652 may have the same bottom view shape as the light emitting device 100. If there is no the extending portion 654, the bottom width D5 of the opening portion 652 may be equal to or narrower than the top width D6 and may be greater than the width D11 of the light emitting device 100.

The upper width D6 of the opening portion 652 may be set to be one time or more, for example, in the range of 1.2 times to 1.5 times the bottom width D5, and the extraction efficiency of light may be lowered when the upper width D5 is smaller than the range of the bottom width D6 and the bottom width D42 of the recess 315 of the optical lens 300 when the upper width D5 is larger than the above range. The upper width D6 of the opening portion 652 may be 2 mm or less, for example, in a range of 1.4 mm to 1.8 mm. If the upper width D6 of the opening portion 652 is smaller than the above range, the extended portion 654 of the opening portion 652 may be reduced in area and the supporting function of the opening portion 652 may be deteriorated, and if the upper width D6 of the opening portion 652 is greater than the above range, the bottom area of the recess 315 of the optical lens 300 may be increased.

The bottom width D42 of the recess 315 of the optical lens 300 may be equal to or less than the upper width D6 of the opening portion 652 of the fixing plate 650. Thus the light emitted through the opening portion 652 of the fixing plate 650 is incident on the recess 315 of the optical lens 300 and a part of the light is incident through the first bottom portion 312 of the bottom surface. A portion of the first bottom portion 312 of the bottom surface 310 of the optical lens 300 may overlap the opening portion 652 of the fixing plate 650 in the vertical direction.

A top surface position of the extended portion 654 of the opening portion 652 is disposed at a position lower than the active layer in the light emitting device 100 to reduce loss of light emitted to the side surface of the active layer. The top surface position of the extended portion 654 of the opening portion 652 may be disposed at a position of ⅓ or less of the thickness of the light emitting device 100. If the top surface position of the extended portion 654 of the opening portion 652 is higher than the above range, the loss of light emitted to the side of the light emitting device 100 may be increased.

The fixing plate 650 may include fixing grooves 665 or fixing protrusions 350 as coupling means. When the fixing groove 665 is disposed as the coupling means of the fixing plate 650, the fixing groove 665 may be at a depth equal to or less than ½ of the thickness A1 of the fixing plate 650.

The fixing groove 665 may have a circular shape, a polygonal shape, or an elliptical shape. A cross-sectional shape of the fixing groove 665 may have a polygonal or hemispherical, but are not limited thereto. If the cross-sectional shape of the fixing groove 665 has a polygonal or hemispherical shape, the fixing groove 665 may be easily coupled with the fixing protrusion 350 of the optical lens 300. The fixing protrusion 350 of the optical lens 300 may have a shape such as a polygonal shape or a hemispherical shape in which a cross-sectional shape thereof is coupled to the fixing groove 665. The fixing protrusion 350 of the optical lens 300 may be adhered to the fixing groove 665 of the fixing plate 650 with an adhesive (not shown).

A top view shape of the fixing groove 665 and the fixing protrusion 350 may have a continuous shape, or a discontinuous shape. Here, the discontinuous shape may be arranged such that two or more fixing grooves 665 or fixing protrusions 350 are spaced apart from each other along a circle. As another example, the coupling means may be disposed on the fixing plate 650 in the fixing protrusion 350 and in the fixing groove 665 in the optical lens 300.

The fixing plate 650 includes leg portions 661 and 663 bent downward from a supporting portion 651 for supporting the light source lens 300. The leg portions 661 and 663 are increase a position of the fixing plate 650. The leg portions 661 and 663 include first and second leg portions 661 and 663 disposed on opposite sides of the fixing plate 650. The first and second leg portions 661 and 663 may be bent downward from the fixing plate 650. The first and second leg portions 661 and 663 may be bent to be inclined from the fixing plate 650 in the vertical direction or within a range of 90 degrees±10 degrees.

The fixing plate 650 may include fixing portions 662 and 664 bent from the respective leg portions 661 and 663. The fixing portions 662 and 664 include a first fixing portion 662 bent in the horizontal direction from the first leg portion 661 and a second fixing portion 664 bent in the horizontal direction from the second leg portion 663. The first and second fixing portions 662 and 664 are bent outwardly from the first and second leg portions 661 and 663 to provide a horizontal bottom surface. The first and second fixing portions 662 and 664 may be adhered to other structures (e.g., circuit board) by an adhesive member. The first and second fixing portions 662 and 664 may be arranged in a direction parallel to the fixing plate 650. The first and second fixing portions 662 and 664 may block the fixing plate 650 from flowing by fixing the bottoms of the fixing plate 650.

The fixing plate 650 may have first and second fixing portions 662 and 664 at both ends in the first axis X direction and the fixing portions 662 and 664 and the leg portions 661 and 663 may not be disposed at both ends in the second axis direction orthogonal to the first axis X direction.

The interval (R0 in FIG. 7) between the fixing grooves 665 of the fixing plate 650 is a maximum interval, for example, a diameter of the circular fixing groove 665 is 3.0 mm or more, for example, in the range of 3.2 mm to 4.2 mm. If the interval between the fixing grooves 665 is smaller than the above range, the optical lens 300 may be tilted. If the interval is larger than the above range, the area of the second bottom portion 314 of the bottom surface of the optical lens 300 may be reduced and the light loss may be increased.

As another example, the first and second fixing portions 662 and 664 may be bent in inner direction or in inner/outer direction from the first and second leg portions 661 and 663. When the first and second fixing portions 662 and 664 are bent in the inner direction from the first and second leg portions 661 and 663, the fixing plate 650 may be prevented from striking downward. When the first and second fixing portions 662 and 664 are bent inward and outward from the first and second leg portions 661 and 663, a part of the first and second fixing portions 662 and 664 is bent inward and the other portion is bent in the outward direction, so that the fixing plate 650 may be prevented from striking.

In the embodiment, the bent portion in the fixing plate 650 may be angled or curved, and but are not limited thereto.

The fixing plate 650 may be includes the side wall 654 of the opening portion 652 and a gap region 655 between the first and second leg portions 661 and 663, the gap region 655 may be spaced apart at a predetermined interval the fixing plate 650.

The height of the top surface of the fixing plate 650 may be 1 mm or less, for example, in a range of 0.6 mm to 0.9 mm. When the height of the fixing plate 650 is smaller than the above range, the thickness A1 of the fixing plate 650 becomes thin and the function as the fixing plate 650 may be deteriorated, and when the height of the fixing plate 650 is larger than the above range, the height of the light source unit may be increased. Since the height of the top surface of the fixing plate 650 is higher than the top surface of the light emitting device 100, the light emitting device 100 disposed in the fixing plate 650 may be protected and the light emitted from the light emitting device 100 may guide to the optical lens 300.

A white layer (not shown) may be formed on the top surface of the fixing plate 650, and is formed of a layer added to a metal oxide such as $SiO_2$, $Al_2O_3$, or $TiO_2$ in the resin material. The white layer may contact the first bottom portion 312 of the bottom surface 310 of the optical lens 300. The white layer may reflect the light leaked from the bottom surface 310 of the optical lens 300.

The bottom surface 310 of the optical lens 300 may be disposed on a region between the fixing groove 665 of the fixing plate 650 and the opening portion 652 of the first bottom portion 312, and the second bottom portion 314 may be spaced from the top surface of the fixing plate 650. The configuration of the optical lens 300 according to the embodiment will be described with reference to the configuration of the first embodiment.

The width of the optical lens 300 may be equal to or less than the transverse length (X-axis length) and the longitudinal length (Y-axis length) of the fixing plate 650. As another example, the width of the optical lens 300 may be larger than the width of the top surface of the fixing plate 650 and the length of the top surface. Most of the light emitted from the light emitting device 100 may be guided to the recess 315 of the optical lens 300 through the opening portion 652 of the fixing plate 650, and a loss of the light traveling to the bottom surface 310 of the light guide plate 310 may be reduced. Accordingly, the width of the optical lens 300 may be made larger than the top surface of the fixing plate 650.

The light emitting device 100 may be disposed in the opening portion 652 of the fixing plate 650. Since the side wall 654 of the opening portion 652 may be disposed around the light emitting device 100, the light emitted from the light emitting device 100 may be reflected.

The distance G5 between the light emitting device 100 and the bottom of the recess 315 of the optical lens 300 may be 1 mm or less, for example, 0.7 mm or less. Accordingly, the light emitted from the light emitting device 100 may be effectively incident on the recess 315 of the optical lens 300.

Figure 10:
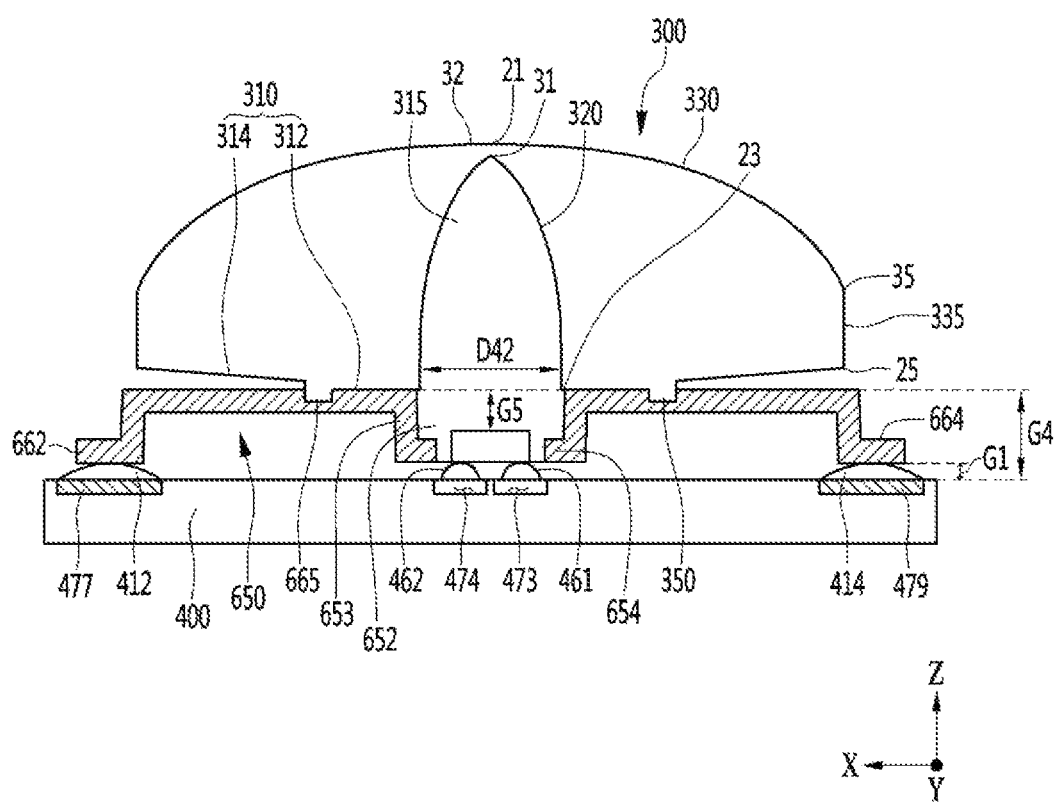
FIG. 10 is an example in which the fixing plate of FIG. 8 is disposed on a circuit board.

Referring to FIG. 10, the light source unit includes a circuit board 400 disposed under the fixing plate 650. One or a plurality of the light emitting devices 100 in the fixing plate 650 may be arranged on the circuit board 400 at a predetermined interval. The light emitting device 100 is disposed between the optical lens 300 and the circuit board 400 and receives power from the circuit board 400 to emit light.

The fixing plate 650 may be disposed between the circuit board 400 and the optical lens 300. The circuit board 400 may have a transverse length and a longitudinal length of the fixing plate 650. One or a plurality of the fixing plates 650 may be disposed on the circuit board 400. The plurality of fixing plates 650 may be arranged in one or more rows.

The circuit board 400 may include a circuit layer electrically connected to the light emitting device 100. The light emitting device 100 may be connected to the lead electrodes 473 and 474 of the circuit board 400 through adhesive members 461 and 462. The adhesive members 461 and 462 are electrically conductive materials and may include solder.

The fixing plate 650 may not be electrically connected to the circuit board 400. The first and second fixing portions 662 and 664 of the fixing plate 650 may be adhered to the fixing patterns 477 and 479 of the circuit board 400 by adhesive members 412 and 414. The adhesive members 412 and 414 may include a material such as solder. The fixed patterns 412 and 414 may be electrically disconnected from the lead electrodes 473 and 474. The circuit board 400 may include at least one of a resin-based PCB, a metal core PCB (MCPCB) having a metal core, and a flexible PCB (FPCB), but is not limited thereto.

The light emitting device 100 is driven by receiving power from the circuit board 400. The optical lens 300 receives the light emitted from the light emitting device 100 through the incident surface 320 and emits to the light exit surfaces 330 and 335. Part of the light incident from the incident surface 320 of the optical lens 300 may be reflected by the bottom surface 310 through a predetermined path and emitted to the first or second light exit surface 330 or 335.

Figure 12:
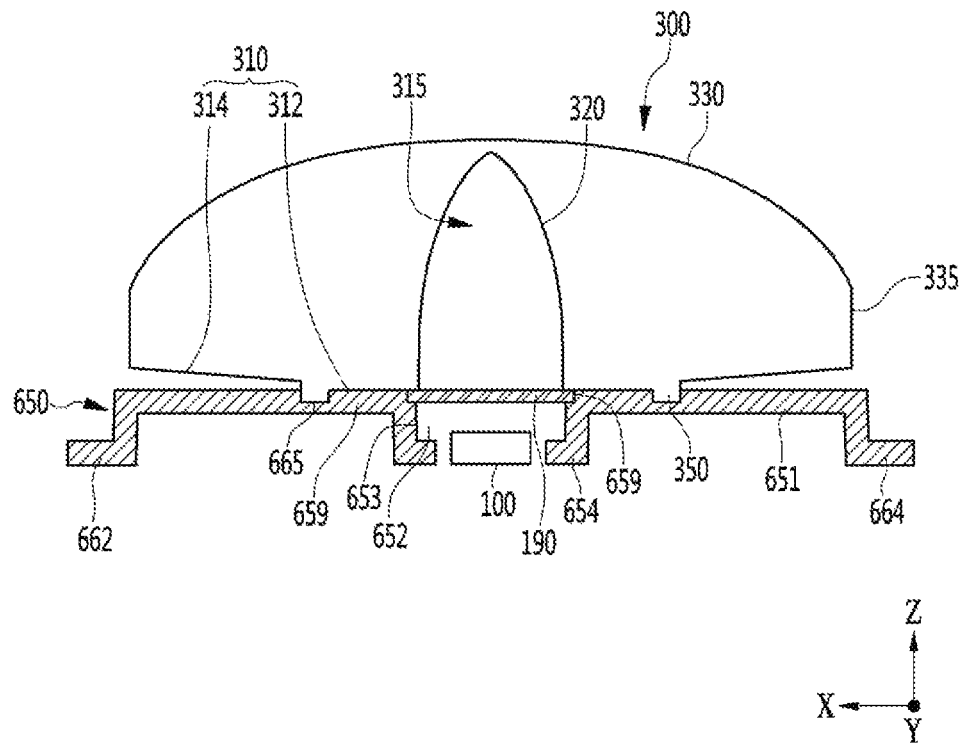
FIG. 12 is another example of the light source unit of FIG. 8.

Referring to FIG. 12, a light source unit includes a light emitting device 100 disposed in an opening portion 652 of a fixing plate 650 and includes a phosphor film 190 disposed between the light emitting device 100 and the optical lens 300.

A step structure 659 may be formed around the upper portion of the opening portion 652 of the fixing plate 650 and the outer side of the phosphor film 190 may be inserted into the step structure 659. The outer side of the phosphor film 190 may be disposed between the bottom surface 310 of the optical lens 300 and the step structure 659 of the fixing plate 650.

The phosphor film 190 may be spaced apart from the light emitting device 100. The phosphor film 190 may be disposed on the bottom of the optical lens 300. Such a phosphor film 190 may reduce damage due to heat generated from the light emitting device 100, and reliability of the phosphor film 19 may be improved. Here, the light emitting device 100 may be a light emitting chip, and may not include a layer or a film having a separate phosphor.

The phosphor film 190 includes at least one or more of a blue phosphor, a cyan phosphor material, a green phosphor material, a yellow phosphor material, and a red phosphor material, and may be a single layer or a multilayer. In the phosphor film 190, a phosphor is added to a transmissive resin material. The transmissive resin material may include a material such as silicone or epoxy, and the phosphor may be selectively formed from YAG, TAG, silicate, nitride, and oxy-nitride materials. The phosphor film 190 may include a phosphor material such as a quantum dot. The quantum dot may include an II-VI compound or an III-V compound semiconductor, and may include at least one of red, green, yellow, and red quantum dots or different types. The quantum dots are nanometer sized particles that may have optical properties resulting from quantum confinement. The specific composition (s), structure and/or size of the quantum dot may be selected so that light of a desired wavelength is emitted from the quantum dots upon excitation with a specific excitation source. By changing the size, the quantum dots may be adjusted to emit light throughout the visible spectrum. The quantum dot may include one or more semiconductor materials, and examples of the semiconductor material include a group IV element, a group II-VI compound, a group II-V compound, a group III-VI compound, a group III-V compound, a group IV-VI compound, a group compound, a group II-IV-VI compound, a group II-IV-V compound, an alloy thereof, and/or 3-membered and 4-membered mixtures or alloys thereof, and mixtures thereof. Examples of the quantum dot may be ZnS, ZnSe, ZnTe, CdS, CdSe, CdTe, GaN, GaP, GaAs, GaSb, InP, InAs, InSb, AlS, AlP, AlAs, PbS, PbSe, Ge, Si, $CuInS_2$, $CuInSe_2$, MgS, MgSe, MgTe, and combinations thereof.

The outer side of the phosphor film 190 may be adhered to the step structure 659 of the fixing plate 650 or may be adhered to the bottom surface 310 of the optical lens 300. Since the outer side of the phosphor film 190 covers the step structure 659 of the fixing plate 650, the phosphor film 190 may be prevented the phosphor film 190 from being stuck in the downward direction, and the deterioration of the phosphor may be reduced. The light emitted from the light emitting device 100 may be wavelength-converted by the phosphor film 190 and incident on the recess 315 of the optical lens 300.

Figure 13:
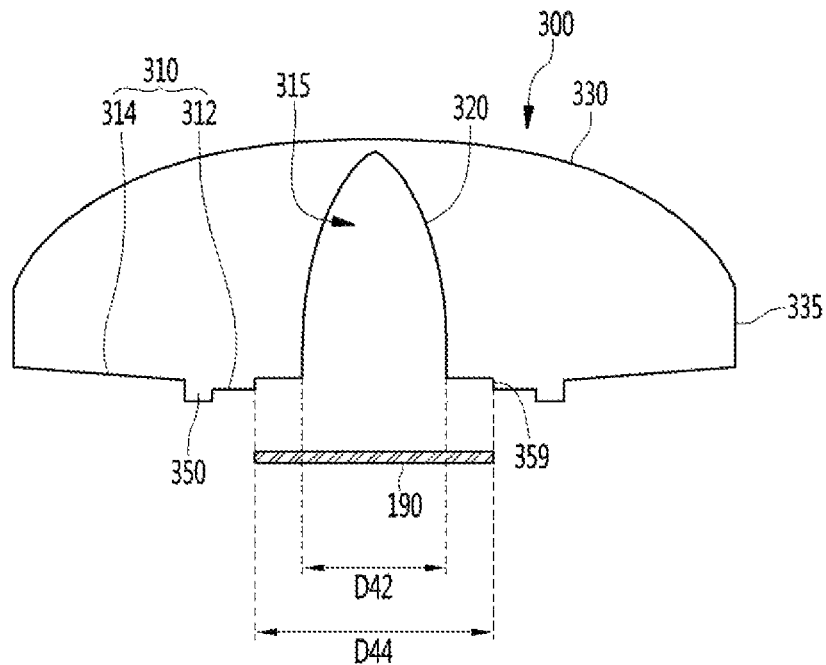
FIG. 13 is a view showing an optical lens and a phosphor film before coupling in the embodiment.
Figure 14:
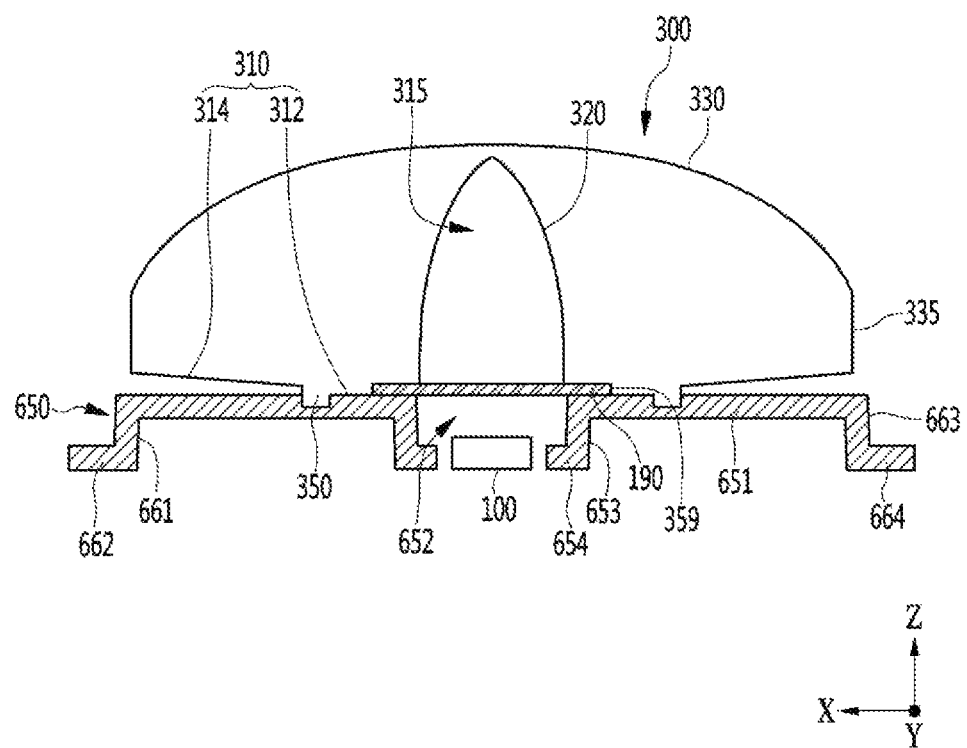
FIG. 14 is an example of a light source unit in which the optical lens and the phosphor film of FIG. 13 are arranged.

FIGS. 13 and 14 show another example of the light source unit equipped with the phosphor film.

Referring to FIGS. 13 and 14, a bottom surface 310 of the optical lens 300 is provided with a step structure 359, and the step structure 359 is convexly recessed from the bottom surface 310. The stepped structure 359 is disposed around the recess 315 of the optical lens 300 and may be located further inside than the fixing protrusion 350. The step structure 359 may be disposed inside the first bottom portion 312 of the bottom surface 310 of the optical lens 300, for example, in contact with the recess 315.

The phosphor film 190 is disposed on the opening portion 652 of the fixing plate 650 and the outer side the phosphor film 190 is inserted into the step structure 359 of the optical lens 300. The phosphor film 190 may be adhered to the step structure 359 of the optical lens 300 with an adhesive (not shown).

The depth of the step structure 359 may be equal to or greater than the thickness of the phosphor film 190. The depth of the step structure 359 may be a depth from the bottom surface 310 of the optical lens 300 to prevent the phosphor film 190 from projecting below the bottom surface 310 of the optical lens 300. The bottom surface of the phosphor film 190 may be in contact with the top surface of the fixing plate 650.

The phosphor film 190 is disposed on the opening portion 652 of the fixing plate 650 and changes the wavelength of the light emitted from the light emitting device 100. The outer side of the phosphor film 190 is sandwiched between the optical lens 300 and the fixing plate 650 so that the problem of deterioration of the phosphor due to the heat generated from the light emitting device 100 may be solved.

Figure 15:
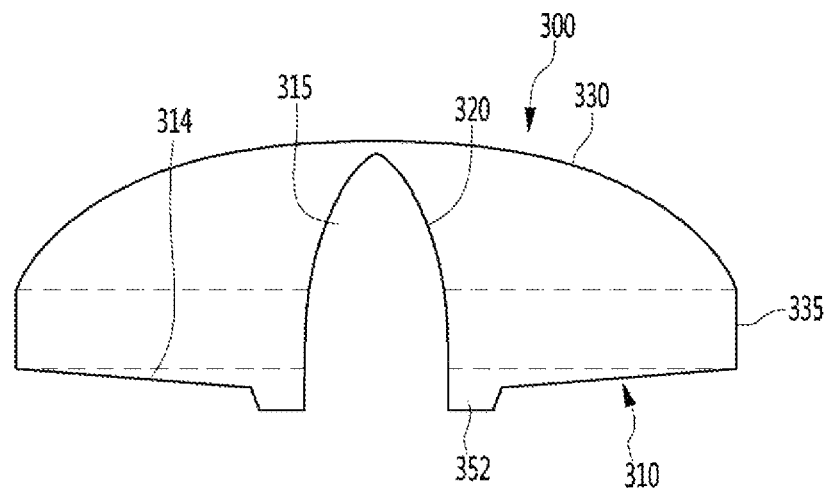
FIG. 15 is another example of the optical lens according to the embodiment.
Figure 16:
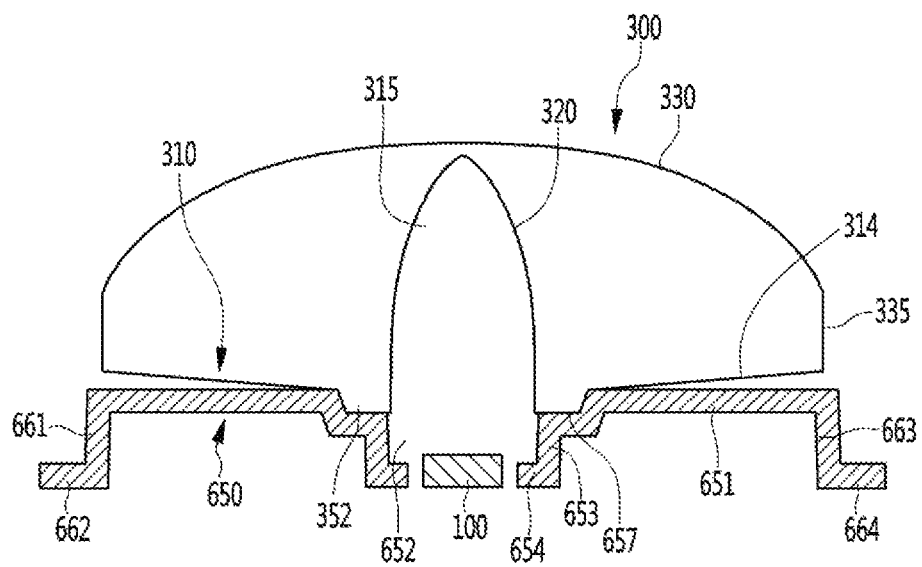
FIG. 16 is an example of a light source unit having the optical lens of FIG. 15.
Figure 16:
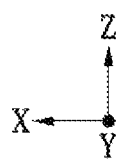

Referring to FIGS. 15 and 16, the coupling means of the fixing plate 650 and the optical lens 300 may be disposed in the region adjacent to the recess 315. The fixing plate 650 may be provided with a coupling means, for example, a fixing groove 657 around the opening portion 652. A fixing protrusion 352 which is a coupling of the optical lens 300 is coupled to the fixing groove 657 and may be disposed around the recess 315 of the optical lens 300.

A side sectional shape of the fixing groove 657 of the fixing plate 650 has a shape in which the upper width thereof is larger than the lower width thereof, and a depth of the fixing groove 657 may be equal to or greater than the height of the fixing protrusion 350.

The fixing protrusion 352 of the optical lens 300 may be disposed around the lower portion of the recess 315. At this time, the lower periphery of the recess 315 may be disposed closer to the light emitting device 100 by the fixing protrusion 350. That is, the bottom of the recess 315 is disposed at a lower position than the top surface of the fixing plate 650, so that light may be effectively incident on the recess 315. Further, since the lower portion of the recess 315 is low, light that leaks to the outside of the recess 315 may be blocked. An outer surfaces of the fixing grooves 665 and the fixing protrusions 350 may be formed with inclined surface. This inclined surface may reflect light emitted from the light emitting device 100, thereby reducing light loss.

Figure 17:
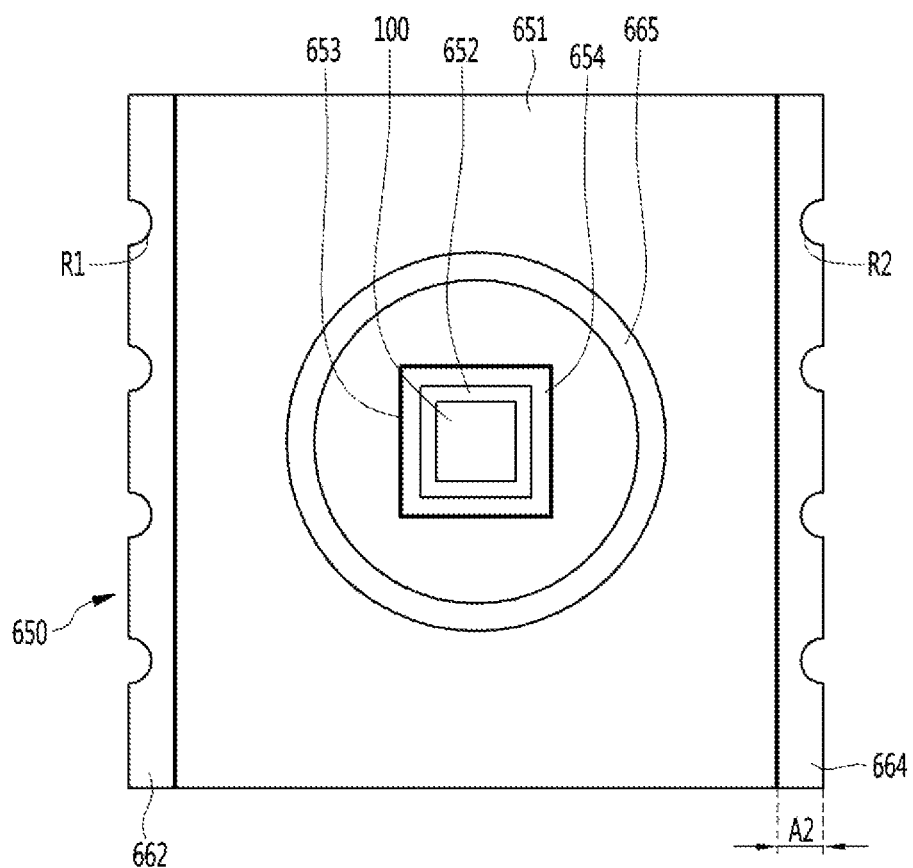
FIG. 17 is another example of the fixing plate in FIG. 7.

Referring to FIG. 17, the first and second fixing portions 662 and 664 of the fixing plate 650 may have a plurality of concave portions R1 and R2. The plurality of concave portions R1 and R2 may be spaced apart from each other on the first and second fixing portions 662 and 664. Each of the plurality of concave portions R1 and R2 may be hemispherical or polygonal, but is not limited thereto. The depths of the concave portions R1 and R2 may be smaller than the width A2 of the first and second fixing portions 662 and 664, but is not limited thereto. The contact areas of the plurality of concave portions R1 and R2 with the first and second fixing portions 662 and 664 may be increased.

Figure 18:
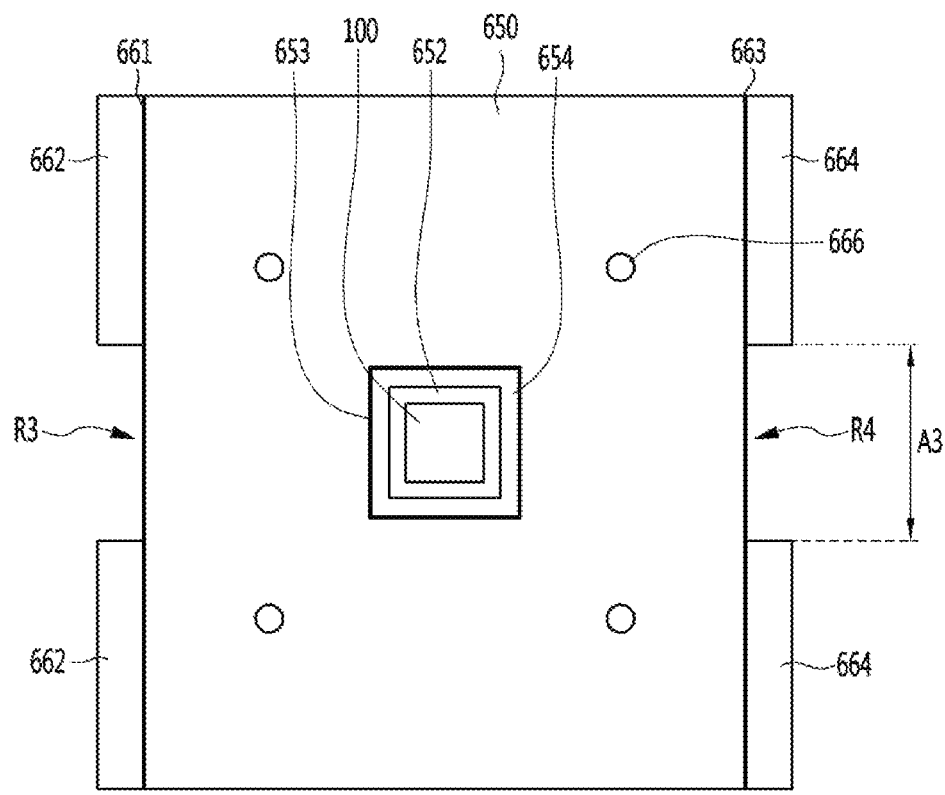
FIG. 18 is another example of the fixing plate in FIG. 7.

Referring to FIG. 18, at least two of the first and second fixing portions 662 and 664 of the fixing plate 650 may be spaced apart from each other. The first and second fixing portions 662 and 664 may be bent from the first and second leg portions 661 and 663. A region between the first and second fixing parts 662 and 664 may be the open region R4. The first and second fixing portions 662 and 664 may be connected to the first and second leg portions 661 and 663 in two or more, for example, three or more, and the open region R4 may be formed in one or plurality on an outer region of the first and second leg portions 661 and 663. By providing the open region R4 and the plurality of fixing portions 662 and 664, the adhesion efficiency may be improved. As another example, the first and second leg portions 661 and 663 may be formed by extending the open region R4.

A plurality of fixing grooves 666 of the fixing plate 650 may be disposed in a region having the same radius from the center of the opening portion 652 so as to be spaced apart from each other. Each of the fixing grooves 666 of the fixing plate 650 may have a circular shape or a polygonal shape and is not limited thereto.

The fixing grooves 666 may be arranged in a number corresponding to the position corresponding to the fixing protrusions of the optical lens, for example, three or four or more. Further, each of the fixing grooves 666 may be located at the same distance from the center of the opening portion 652, or at least one may be spaced apart or closer to the other.

Figure 19:
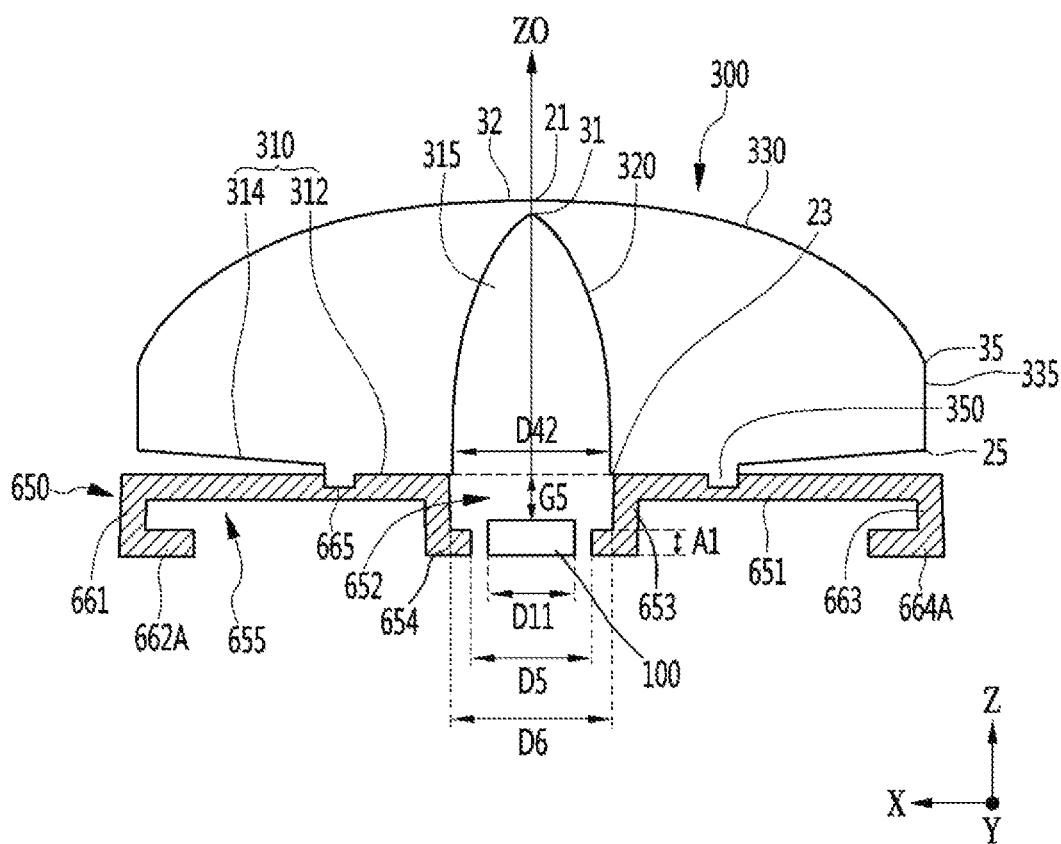
FIG. 19 is another example of the fixing plate in FIG. 7.

Referring to FIG. 19, the first and second fixing portions 662A and 664A may be bent inward from the first and second leg portions 661 and 663, respectively. Since the first and second fixing portions 662A and 664A are bent inward from the first and second leg portions 661 and 663, a size and area of the fixing plate 650 may be reduced. Each of the first and second fixing portions 662A and 664A may be one or a plurality of, but is not limited thereto.

Figure 20:
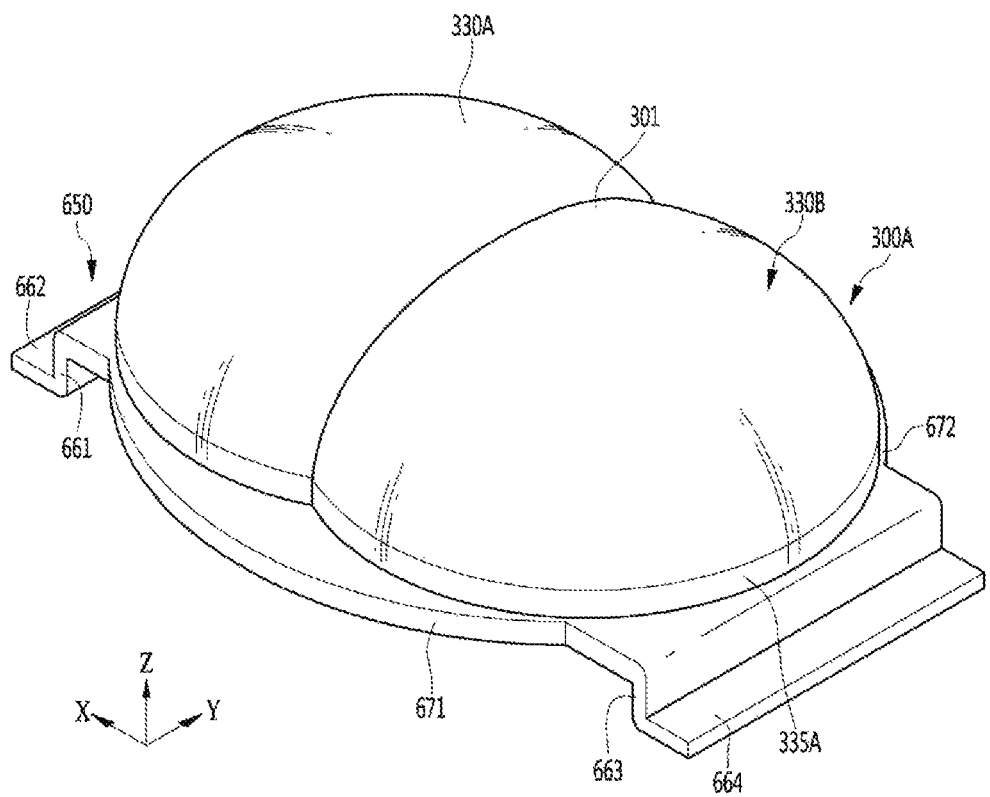
FIG. 20 is a perspective view showing the light source unit according to the third embodiment.
Figure 21:
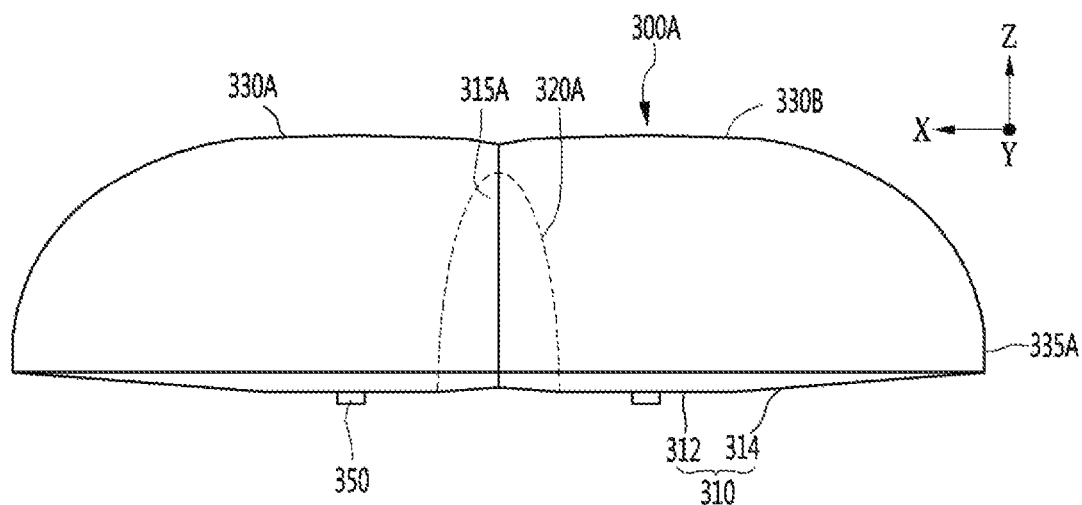
FIG. 21 is a side view showing the optical lens of the light source unit of FIG. 20.

FIGS. 20 to 21 are views showing the light source unit according to the third embodiment.

Referring to FIGS. 20 and 21, the light source unit has a configuration in which a fixing plate 650 having an opening portion and an optical lens 300A are arranged on the fixing plate 650. The light emitting device according to the embodiment may be disposed in the opening portion of the fixing plate 650, and the opening portion and the light emitting device will be described with reference to the description of the embodiments described above.

The optical lens 300A is formed such that the length of one axis Y of the two axes X and Y passing through the center of the bottom surface 310 has a minimum value, and the light exit surfaces 330A, 330B, and 335A may be integrally formed in a three-dimensional shape similar to the bottom surface 310, and may have at least one curved point.

The optical lens 300A includes a bottom surface 310 having two axes X and Y passing through the center and having different lengths from each other, a recess 310 and an incident surface 320A recessed inwardly from a center region of the bottom surface 310, a plurality of first light exit surfaces 330A and 330B for emitting light emitted through the incident surface 320A, and a second light exit surface 335A between the bottom surface 310 and the plurality of first light exit surface 330A and 330B.

The bottom surface 310 has a minimum axis X of one of the two axes X and Y passing through the center of the optical lens 300A and has axial symmetry. That is, the length of the horizontal X-axis passing through the center of the optical lens 300A is longer than the length of the horizontal Y-axis passing through the center of the optical lens 300A. At this time, the length of the Y-axis has the minimum length of the bottom length of the optical lens 300A. Accordingly, an outer shape of the bottom surface 310 may have a shape of "8" character or two hemispherical shapes overlapping with each other.

The first light exit surfaces 330A and 330B have at least one curvature within a range of 30% to 70% based on the effective diameter. In addition, the thickness of the center of the optical lens 300A may always have a minimum value. The second light exit surface 335A may be formed as a flat surface around the outer periphery of the optical lens 300A or may be formed as an inclined surface.

The fixing plate 650 may include outer portions 671 and 672 whose top surfaces protrude outward toward the center region. The outer portions 617 and 672 may have the same outer shape as the outer shape of the optical lens 300A or a hemispherical shapes, but is not limited thereto.

Figure 22:
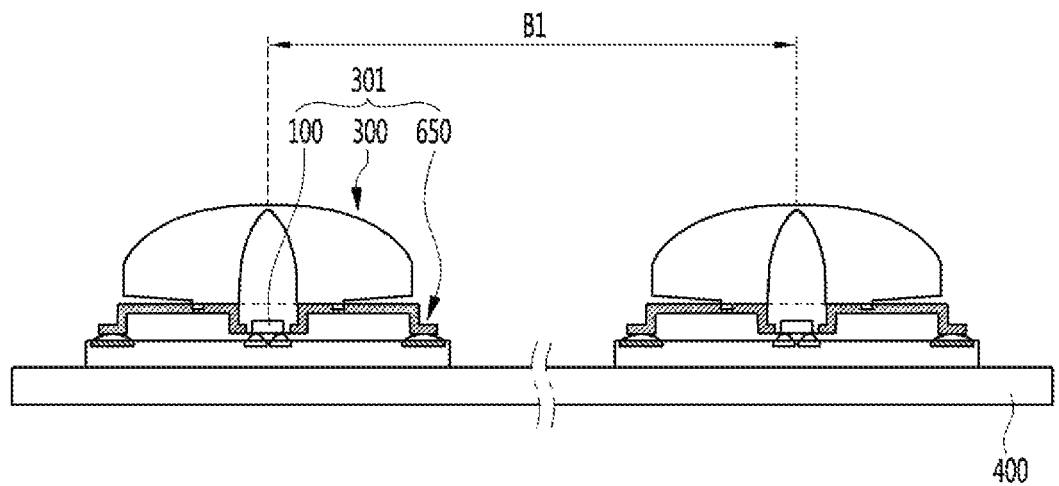
FIG. 22 is another example in which the light source unit according to the embodiment is arranged on a circuit board.

Referring to FIG. 22, a structure in which a plurality of light source units 301 are arranged on a circuit board 400 may be shown.

The interval B1 between the plurality of light source units, for example, an interval between the optical lenses 300, may be spaced such that the interference between the light emitted from the adjacent optical lens 300 may be eliminated.

Figure 23:
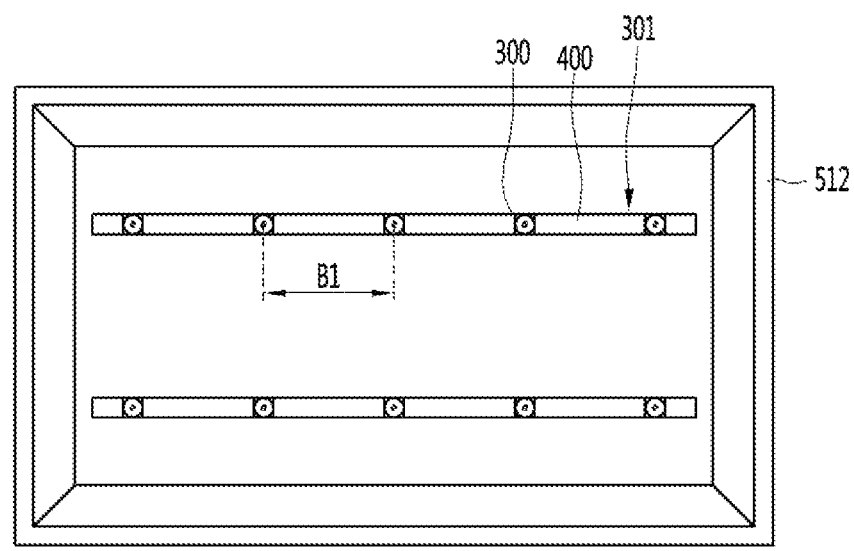
FIG. 23 is a view showing a light unit in which the light source units according to the embodiment are arranged.

Referring to FIG. 23, the light unit may include a plurality of light source units 301 disposed in the bottom cover 512, and the plurality of light source units 301 may include at least one row on each of the plurality of circuit boards 400. The circuit board 400 may include a circuit layer electrically connected to the light emitting device 100. The bottom cover 512 may include a metal or a thermally conductive resin material for heat dissipation. The bottom cover 512 may include a receiving portion, and a side cover may be provided around the receiving portion.

A reflective sheet (not shown) may be disposed on the circuit board 400 according to the embodiment. The reflective sheet may be formed of, for example, PET, PC, PVC resin or the like, but is not limited thereto. An optical sheet (not shown) may be disposed on the light source unit 301 according to the embodiment or on the bottom cover 512, and the optical sheet may include at least one of prism sheet for collecting scattered light and a diffusion sheet for re-diffusing the diffusion sheet. A light guide layer (not shown) may be disposed in a region between the optical sheet and the light source unit 301, but is not limited thereto.

Figure 24:
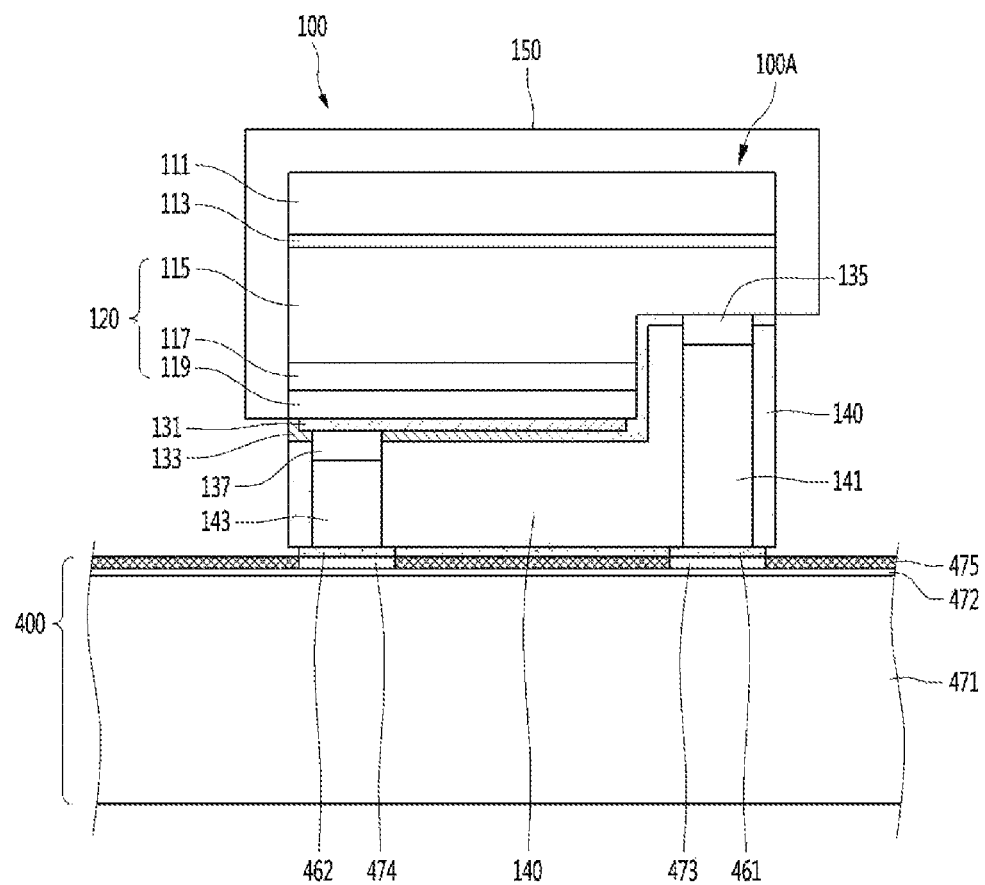
FIG. 24 is a first example showing a light emitting device of the light source unit according to the embodiment.

Examples of the light emitting device according to the embodiment will be described with reference to FIGS. 24 to 26. FIG. 24 is a view showing a first example of the light emitting device according to the embodiment. An example of a light emitting device and a circuit board will be described with reference to FIG. 24.

Referring to FIG. 24, the light emitting device 100 includes a light emitting chip 100A. The light emitting device 100 may include the light emitting chip 100A and a phosphor layer 150 disposed on the light emitting chip 100A. The phosphor layer 150 may include at least one of a blue phosphor, a green phosphor, a yellow phosphor, and a red phosphor and may be disposed with a single layer or a multi-layer. In the phosphor layer 150, a phosphor is added to a light-transmitting resin material. The light-transmitting resin material may include a material such as silicon or epoxy, and the phosphor may be made of YAG, TAG, silicate, nitride, or oxynitride-based material.

The phosphor layer 150 may be disposed on the top surface of the light emitting chip 100A, or may be disposed on the top surface and the side surface of the light emitting chip 100A. The phosphor layer 150 may be disposed on a region where light is emitted on the surface of the light emitting chip 100A, and may convert a wavelength of light.

The phosphor layer 150 may include a single phosphor layer or different phosphor layers. A first layer of the different phosphor layers may include at least one of a red phosphor, a yellow phosphor, and a green phosphor. A second layer of the different phosphor layers is formed on the first layer and may include a phosphor different from the first layer among the red phosphor, the yellow phosphor, and the green phosphor. As another example, the different phosphor layers may include phosphor layers of three layers or more, but is not limited thereto.

As another example, the phosphor layer 150 may include a film type phosphor layer. Since the film type phosphor layer provides a uniform thickness, a color distribution according to a wavelength conversion may be uniform.

The light emitting chip 100A may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140.

The substrate 111 may be a light-transmitting substrate, an insulating substrate, or a conductive substrate and may use at least one of sapphire ($Al_2O_3$), SiC, Si, GaAs, GaN, ZnO, Si, GaP, InP, Ge, and $Ga_2O_3$. A plurality of convex portions (not illustrated) are formed on either or both of the top surface and the bottom surface of the substrate 111 to thereby improve light extraction efficiency. A side sectional shape of each convex portion may include at least one of a hemispherical shape, a semi-oval shape, and a polygonal shape. The substrate 111 may be removed from the light emitting chip 100A. In this case, the first semiconductor layer 113 or a first conductive semiconductor layer 115 may be disposed as a top layer of the light emitting chip 100A.

The first semiconductor layer 113 may be formed under the substrate 111. The first semiconductor layer 113 may be formed using a compound semiconductor of group II to V elements. The first semiconductor layer 113 may be formed with a single layer or a plurality of layers using a compound semiconductor of group II to V elements. The first semiconductor layer 113 may include a semiconductor layer using a compound semiconductor of group III-V elements. For example, the first semiconductor layer 113 may include at least one of GaN, InN, AlN, InGaN, AlGaN, InAlGaN, AlInN, AlGaAs, GaP, GaAs, GaAsP, AlGaInP, and GaP. The first semiconductor layer 113 may have an empirical formula of $In_xAl_yGa_{1-x-y}N$ ($0 \le x \le 1$, $0 \le y \le 1$, $0 \le x+y \le 1$) and may include at least one of a buffer layer and an undoped semiconductor layer. The buffer layer may reduce a difference of a lattice constant between the substrate 111 and the nitride semiconductor layer, and the undoped semiconductor layer may improve the crystal quality of the semiconductor. Here, the first semiconductor layer 113 may not be formed.

The light emitting structure 120 may be formed under the first semiconductor layer 113. The light emitting structure 120 may be selectively formed using a compound semiconductor of group II to V elements and group III-V elements and may emit light of a certain peak wavelength in a wavelength range from an ultraviolet band to a visible band.

The light emitting structure 120 includes a first conductive semiconductor layer 115, a second conductive semiconductor layer 119, and an active layer 117 between the first conductive semiconductor layer 115 and the second conductive semiconductor layer 119. Another semiconductor layer may be further disposed above and/or under the respective layers 115, 117, and 119, but embodiments are not limited thereto.

The first conductive semiconductor layer 115 may be disposed under the first semiconductor layer 113 and may be implemented by a semiconductor doped with a first conductive dopant, for example, an n-type semiconductor layer. The first conductive semiconductor layer 115 may have an empirical formula of $In_xAl_yGa_{1-x-y}N$ ($0 \le x \le 1$, $0 \le y \le 1$, $0 \le x+y \le 1$). The first conductive semiconductor layer 115 may be selected from compound semiconductors of group III-V elements, for example, GaN, AlN, AlGaN, InGaN, InN, InAlGaN, AlInN, AlGaAs, GaP, GaAs, GaAsP, and AlGaInP. The first conductive dopant is an n-type dopant and may include a dopant such as Si, Ge, Sn, Se, and Te.

The active layer 117 may be disposed under the first conductive semiconductor layer 115 and may have a single quantum well (SQM) structure, a multiple quantum well (MQW) structure, a quantum wire structure, or a quantum dot structure and include a cycle of a well layer and a barrier layer. The cycle of the well layer and the barrier layer includes at least one of pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second conductive semiconductor layer 119 is disposed under the active layer 117. The second conductive semiconductor layer 119 may include a semiconductor doped with a second conductive dopant, for example, an empirical formula of $In_xAl_yGa_{1-x-y}N$ ($0 \le x \le 1$, $0 \le y \le 1$, $0 \le x+y \le 1$). The second conductive semiconductor layer 119 may include at least one of compound semiconductors, such as GaN, InN, AlN, InGaN, AlGaN, InAlGaN, AlInN, AlGaAs, GaP, GaAs, GaAsP, and AlGaInP. The second conductive semiconductor layer 119 may be a p-type semiconductor layer, and the first conductive dopant may include a p-type dopant such as Mg, Zn, Ca, Sr, and Ba.

As another example of the light emitting structure 120, the first conductive semiconductor layer 115 may be implemented by a p-type semiconductor layer, and the second conductive semiconductor layer 119 may be implemented by an n-type semiconductor layer. A third conductive semiconductor layer having an opposite polarity to the second conductive semiconductor layer may be formed above the second conductive semiconductor layer 119. Also, the light emitting structure 120 may have any one structure selected from an n-p junction structure, a p-n junction structure, an n-p-n junction structure, and a p-n-p junction structure.

The electrode layer 131 is disposed under the second conductive semiconductor layer 119. The electrode layer 131 may include a reflection layer. The electrode layer 131 may include an ohmic contact layer contacting the second conductive semiconductor layer 119 of the light emitting structure 120. The reflection layer may include a material having a reflectivity of 70% or more, for example, metals such as Al, Ag, Ru, Pd, Rh, Pt, and Ir, and alloys including two or more of the metals. The metal of the reflection layer may contact a lower portion of the second conductive semiconductor layer 119. The ohmic contact layer may include a light-transmitting material, a metal material, or a non-metal material.

The electrode layer 131 may include a stacked structure of a light-transmitting electrode layer and a reflection layer. The light-transmitting electrode layer may include indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, or selective combinations thereof. A reflection layer made of a metal material may be disposed under the light-transmitting electrode layer and may include Ag, Ni, Al, Rh, Pd, Ir, Ru, Mg, Zn, Pt, Au, Hf, or selective combinations thereof. As another example, the reflection layer may have a distributed Bragg reflector (DBR) structure in which two layers having different refractive indices are alternately disposed.

A light extraction structure such as roughness may be disposed on at least one of the second conductive semiconductor layer 119 and the electrode layer 131. The light extraction structure changes a critical angle of incident light to improve light extraction efficiency.

The insulating layer 133 may be disposed under the electrode layer 131 and may be disposed on a bottom surface of the second conductive semiconductor layer 119, side surfaces of the second conductive semiconductor layer 119 and the active layer 117, and a portion of the first conductive semiconductor layer 115. The insulating layer 133 is formed in a lower portion of the light emitting structure 120, except for the electrode layer 131, the first electrode 135, and the second electrode 137 and electrically protect the lower portion of the light emitting structure 120.

The insulating layer 133 includes an insulating material or an insulating resin made of at least one of oxide, nitride, fluoride, and sulfide including at least one of Al, Cr, Si, Ti, Zn, and Zr. The insulating layer 133 may be selectively made of $SiO_2$, $Si_3N_4$, $Al_2O_3$, and $TiO_2$. The insulating layer 133 may be formed with a single layer or a multi-layer, but is not limited thereto. When a metal structure for flip bonding is formed under the light emitting structure 120, the insulating layer 133 is formed for preventing the inter-layer short of the light emitting structure 120.

The insulating layer 133 may have a DBR structure in which a first layer and a second layer having different refractive indices are alternately disposed. The first layer may be made of any one of $SiO_2$, $Si_3N_4$, $Al_2O_3$, and $TiO_2$, and the second layer may be made of any one of $SiO_2$, $Si_3N_4$, $Al_2O_3$, and $TiO_2$ except for the material of the first layer, but embodiments are not limited thereto. Alternatively, the first layer and the second layer may be made of the same material or may be made of a pair having three or more layers. In this case, the electrode layer may not be formed.

The first electrode 135 may be disposed under a portion of the first conductive semiconductor layer 115, and the second electrode 137 may be disposed under a portion of the electrode layer 131. The first connection electrode 141 is disposed under the first electrode 135, and the second connection electrode 143 is disposed under the second electrode 137.

The first electrode 135 may be electrically connected to the first conductive semiconductor layer 115 and the first connection electrode 141, and the second electrode 137 may be electrically connected to the second conductive semiconductor layer 119 and the second connection electrode 143 through the electrode layer 131.

The first electrode 135 and the second electrode 137 may be made of at least one of Cr, Ti, Co, Ni, V, Hf, Ag, Al, Ru, Rh, Pt, Pd, Ta, Mo, W, and alloys thereof and may be formed with a single layer or a multi-layer. The first electrode 135 and the second electrode 137 may be formed with the same stacked structure or different stacked structures. At least one of the first electrode 135 and the second electrode 137 may further include a current diffusion pattern such as an arm or finger structure. Also, one or more first electrodes 135 and one or more second electrodes 137 may be provided, but embodiments are not limited thereto. At least one of the first and second connection electrodes 141 and 143 may be plurally provided, but embodiments are not limited thereto.

The first connection electrode 141 and the second connection electrode 143 provide a heat dissipation function and a lead function for supplying power. The first connection electrode 141 and the second connection electrode 143 may include at least one of a circular shape, a polygonal shape, a cylindrical shape, and a polyprism shape. The first connection electrode 141 and the second connection electrode 143 may be made of a metal powder, for example, Ag, Al, Au, Cr, Co, Cu, Fe, Hf, In, Mo, Ni, Si, Sn, Ta, Ti, W, or selective alloys thereof. The first connection electrode 141 and the second connection electrode 143 may be plated with any one of In, Sn, Ni, Cu, and selective alloys thereof, so as to improve adhesion with the first electrode 135 and the second electrode 137.

The support layer 140 includes a thermally conductive material and may be disposed around the first electrode 135, the second electrode 137, the first connection electrode 141, and the second connection electrode 143. The bottom surfaces of the first and second connection electrodes 141 and 143 may be exposed on the bottom surface of the support layer 140.

The support layer 140 is used as a layer for supporting the light emitting device 100. The support layer 140 is made of an insulating material, and the insulating material includes a resin layer such as silicon or epoxy. As another example, the insulating material may include a paste or an insulating ink. Examples of the insulating material may include a polyacrylate resin, an epoxy resin, a phenolic resin, a polyamides resin, a polyimides rein, an unsaturated polyesters resin, a polyphenylene ether resin (PPE), a polyphenylene oxide resin (PPO), a polyphenylenesulfides resin, a cyanate ester resin, a benzocyclobutene (BCB), a polyamido-amine dendrimers (PAMAM), polypropylene-imine dendrimers (PPI), and PAMAM-OS (organosilicon) having an inner structure of PAMAM and an outer structure of organo-silicon, alone or in combination thereof. The support layer 140 may be made of a different material from the insulating layer 133.

At least one of compounds such as oxide, nitride, fluoride, and sulfide including at least one of Al, Cr, Si, Ti, Zn, and Zr may be added to the support layer 140. The compounds added to the support layer 140 may be a heat dispersing agent, and the heat dispersing agent may be used as a powder particle with a certain size, a grain, a filler, or an additive. The heat dispersing agent includes a ceramic material, and the ceramic material includes at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride. The ceramic material may be made of metal nitride having higher heat conductivity than nitride or oxide among insulating materials. The metal nitride may include a material having heat conductivity of 140 W/mK or more. The ceramic material may be a ceramic-based material such as $SiO_2$, $Si_xO_y$, $Si_3N_4$, $Si_xN_y$, $SiO_xN_y$, $Al_2O_3$, BN, $Si_3N_4$, SiC (SiC—BeO), BeO, CeO, or AN. The thermally conductive material may include C (diamond, CNT) compounds.

The light emitting chip 100A is mounted on the circuit board 400 in a flip manner. The circuit board 400 includes a metal layer 471, an insulating layer 472 disposed above the metal layer 471, a circuit layer (not illustrated) having a plurality of lead electrodes 473 and 474 above the insulating layer 472, and a protection layer 475 protecting the circuit layer. The metal layer 471 is a heat dissipation layer, may include a metal having high heat conductivity, such as Cu or Cu alloy, and may be formed with a single-layered structure or a multi-layered structure.

The insulating layer 472 insulates the metal layer 471 from the circuit layer. The insulating layer may include at least one of resin materials, such as epoxy, silicon, glass fiber, prepreg, Polyphthalamide (PPA), liquid crystal polymer (LCP), and polyamide9T (PAST). Also, an additive such as a metal oxide, for example, $TiO_2$, $SiO_2$, and $Al_2O_3$, may be added to the insulating layer 472, but is not limited thereto. As another example, the insulating layer 472 may be used by adding graphene or the like to an insulating material such as silicon or epoxy, but is not limited thereto.

The insulating layer 472 may be an anodized region which is formed by a process of anodizing the metal layer 471. The metal layer 471 may be made of aluminum, and the anodized region may be made of a material such as $Al_2O_3$.

The first and second lead electrodes 473 and 474 are electrically connected to the first and second connection electrodes 141 and 143 of the light emitting chip 100A. Conductive adhesives 461 and 462 may be disposed between the first and second lead electrodes 473 and 474 and the first and second connection electrodes 141 and 143 of the light emitting chip 100A. The conductive adhesives 461 and 462 may include a metal material such as a solder material. The first lead electrode 473 and the second lead electrode 474 are circuit patterns and supply power.

The protection layer 475 may be disposed above the circuit layer. The protection layer 475 includes a reflective material. The protection layer 475 may be made of a resist material, for example, a white resist material, but is not limited thereto. The protection layer 475 may function as a reflection layer. For example, the protection layer 475 may be made of a material whose reflectivity is higher than absorptivity. As another example, the protection layer 475 may be made of a light-absorbing material, and the light-absorbing material may include a black resist material.

A second example of the light emitting device will be described with reference to FIG. 25.

Figure 25:
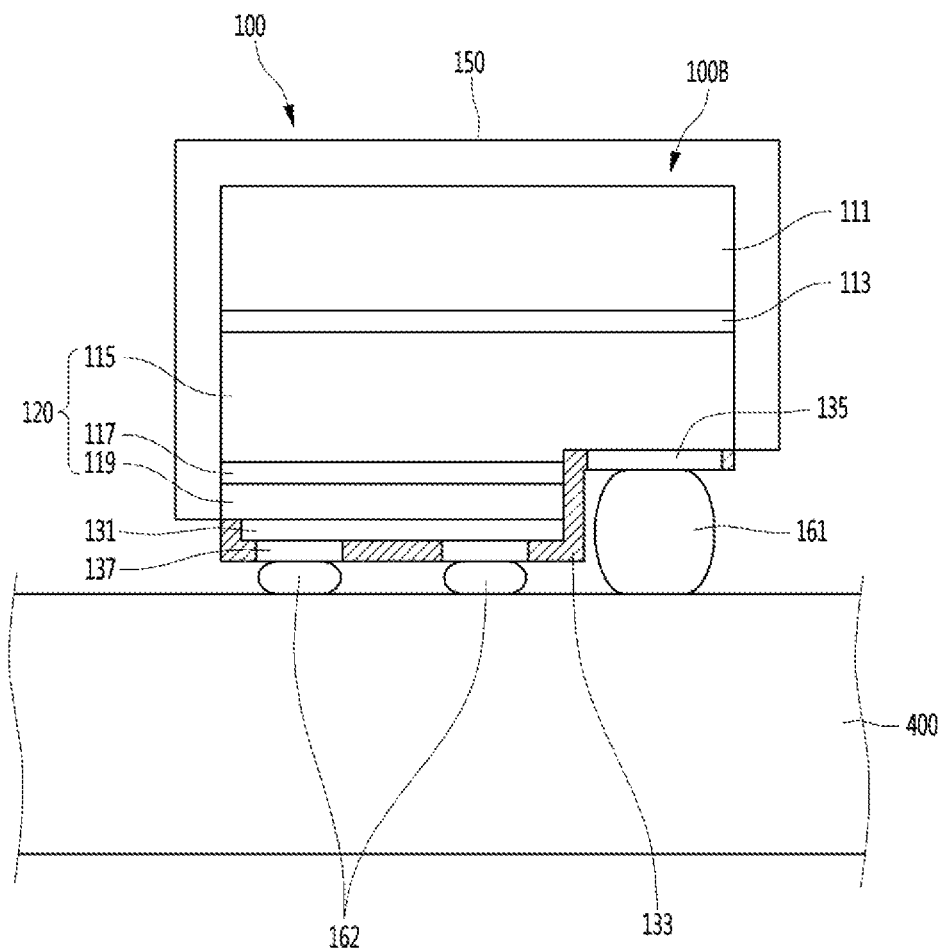
FIG. 25 is a second example showing a light emitting device of the light source unit according to the embodiment.

Referring to FIG. 25, the light emitting device 100 includes a light emitting chip 100B. The light emitting device 100 may include the light emitting chip 100B and a phosphor layer 150 disposed on the light emitting chip 100B. The phosphor layer 150 may include at least one of a blue phosphor, a green phosphor, a yellow phosphor, and a red phosphor and may be disposed with a single layer or a multi-layer. In the phosphor layer 150, a phosphor is added to a light-transmitting resin material. The light-transmitting resin material may include a material such as silicon or epoxy, and the phosphor may be made of YAG, TAG, silicate, nitride, or oxynitride-based material.

The phosphor layer 150 may be disposed on the top surface of the light emitting chip 100B, or may be disposed on the top surface and the side surface of the light emitting chip 100B. The phosphor layer 150 may be disposed on a region where light is emitted on the surface of the light emitting chip 100B, and may convert a wavelength of light.

The light emitting chip 100B may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140. The substrate 111 and the first semiconductor layer 113 may be removed.

The light emitting chip 100B and the circuit board 400 of the light emitting device 100 may be connected through connection electrodes 161 and 162. The connection electrodes 161 and 162 may include a conductive bump, that is, a solder bump. One or more conductive bumps may be disposed under the electrodes 135 and 137, but embodiments are not limited thereto. The insulating layer 133 may expose the first and second electrodes 135 and 137, and the first and second electrodes 135 and 137 may be electrically connected to the connection electrodes 161 and 162.

A third example of the light emitting device will be described with reference to FIG. 26.

Figure 26:
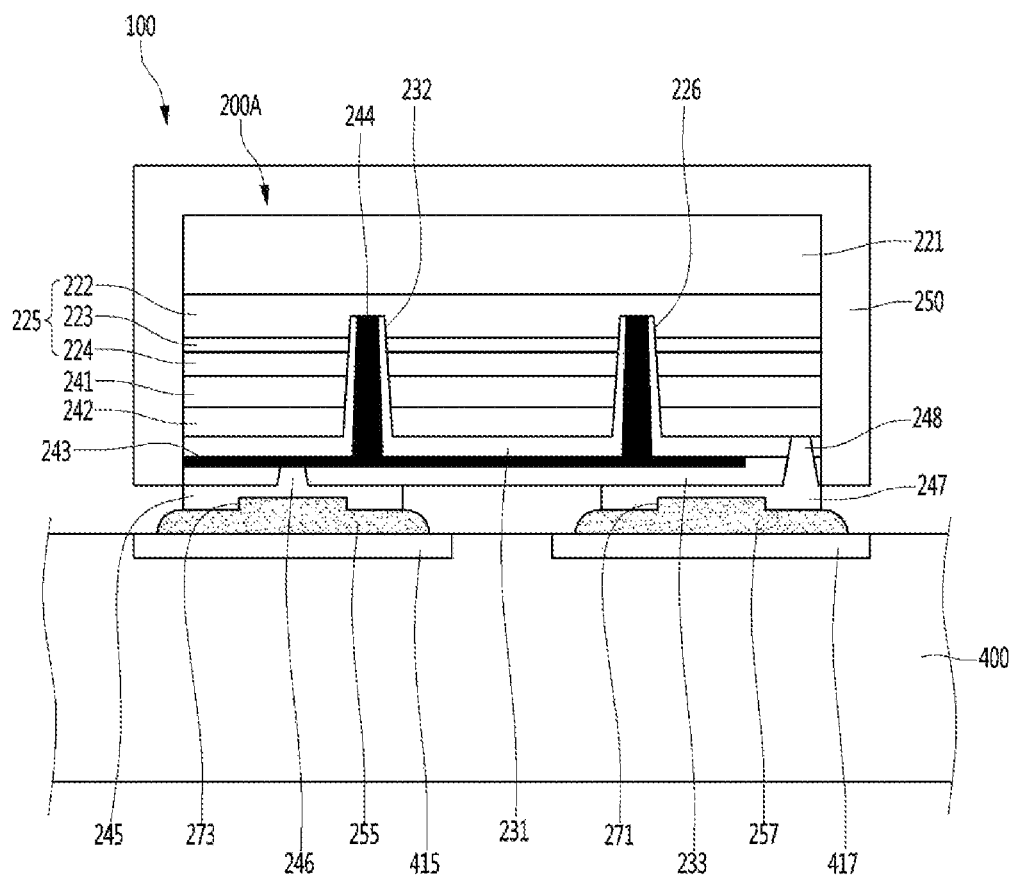
FIG. 26 is a third example of a light emitting device of the light source unit according to the embodiment.

Referring to FIG. 26, the light emitting device 100 includes a light emitting chip 200A connected to a circuit board 400. The light emitting device 100 may include a phosphor layer 250 disposed on the surface of the light emitting chip 200A. The phosphor layer 250 converts a wavelength of incident light. As illustrated in FIG. 4, the optical lens is disposed above the light emitting device 100 to adjust orientation characteristics of light emitted from the light emitting chip 200A.

The light emitting chip 200A may include a light emitting structure 225 and a plurality of pads 245 and 247. The light emitting structure 225 may include compound semiconductor layers of group II to VI elements, for example, a compound semiconductor layer of group III-V elements or a compound semiconductor layer of group II-VI elements. The plurality of pads 245 and 247 are selectively connected to the semiconductor layer of the light emitting structure 225 and supply power.

The light emitting structure 225 includes a first conductive semiconductor layer 222, an active layer 223, and a second conductive semiconductor layer 224. The light emitting chip 200A may include a substrate 221. The substrate 221 is disposed above the light emitting structure 225. The substrate 221 may be a light-transmitting substrate, an insulating substrate, or a conductive substrate. Such a configuration may be understood by referring to the descriptions of the light emitting structure and the substrate with reference to FIG. 4.

The light emitting chip 200A includes pads 245 and 247 at a lower portion, and the pads 245 and 247 include first and second pads 245 and 247. The first and second pads 245 and 247 are spaced apart from each other under the light emitting chip 200A. The first pad 245 is electrically connected to the first conductive semiconductor layer 222, and the second pad 247 is electrically connected to the second conductive semiconductor layer 224. Bottom shapes of the first and second pads 245 and 247 may be a polygonal shape or a circular shape, or may correspond to shapes of the first and second lead electrodes 415 and 417 of the circuit board 400. An area of a bottom surface of each of the first and second pads 245 and 247 may correspond to an area of a top surface of each of the first and second lead electrodes 415 and 417.

The light emitting chip 200A may include at least one of a buffer layer (not illustrated) and an undoped semiconductor layer (not illustrated) between the substrate 221 and the light emitting structure 225. The buffer layer is a layer for reducing a difference of lattice constant between the substrate 221 and the semiconductor layer and may be selectively made of group II to VI compound semiconductors. An undoped group III-V compound semiconductor layer may be further formed under the buffer layer, but embodiments are not limited thereto. The substrate 221 may be removed. When the substrate 221 is removed, the phosphor layer 250 may contact the top surface of the first conductive semiconductor layer 222 or the top surface of another semiconductor layer.

The light emitting chip 200A includes first and second electrode layers 241 and 242, a third electrode layer 243, and insulating layers 231 and 233. Each of the first and second electrode layers 241 and 242 may be formed with a single layer or a multi-layer and may function as a current diffusion layer. The first and second electrode layers 241 and 242 may include a first electrode layer 241 disposed under the light emitting structure 225, and a second electrode 242 disposed under the first electrode layer 241. The first electrode layer 241 diffuses a current, and the second electrode layer 242 reflects incident light.

The first and second electrodes 241 and 242 may be made of different materials. The first electrode layer 241 may be made of a light-transmitting material, for example, metal oxide or metal nitride. The first electrode layer may be selectively made of indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO). The second electrode layer 242 may contact the bottom surface of the first electrode layer 241 and function as a reflection electrode layer. The second electrode layer 242 may include a metal such as Ag, Au, or Al. When a portion of the first electrode layer 241 is removed, the second electrode layer 242 may partially contact the bottom surface of the light emitting structure 225.

As another example, the first and second electrode layers 241 and 242 may be stacked in an Omni Directional Reflector layer (ODR) structure. The ODR structure may be a stacked structure of the first electrode layer 241 having low reflectivity and the second electrode layer 242 contacting the first electrode layer 241 and made of a metal material having high reflectivity. The electrode layers 241 and 242 may have a stacked structure of ITO/Ag. An omnidirectional reflection angle may be improved at an interface between the first electrode layer 241 and the second electrode layer 242.

As another example, the second electrode layer 242 may be removed and may be a reflection layer made of another material. The reflection layer may be formed to have a DBR structure. The DBR structure includes a structure in which two dielectric layers having different refractive indices are alternately disposed. For example, the two dielectric layers may include different layers selected from a $SiO_2$ layer, a $Si_3N_4$ layer, a $TiO_2$ layer, an $Al_2O_3$ layer, and a MgO layer. As another example, the electrode layers 241 and 242 may include both the DBR structure and the ODR structure. In this case, the light emitting device 200A may have light reflectivity of 98% or more. In the light emitting chip 200A mounted in the flip manner, light reflected from the second electrode layer 242 is emitted through the substrate 221. Thus, most of light may be emitted in a vertically upward direction. Also, light emitted to the side surface of the light emitting chip 200A may be reflected to a light incidence surface of an optical lens by a reflection sheet 600.

The third electrode layer 243 is disposed under the second electrode layer 242 and is electrically insulated from the first and second electrode layers 241 and 242. The third electrode layer 243 may include a metal, for example, at least one selected from titanium (Ti), copper (Cu), nickel (Ni), gold (Au), chromium (Cr), tantalum (Ta), platinum (Pt), tin (Sn), silver (Ag), and phosphorus (P). The first pad 245 and the second pad 247 are disposed under the third electrode layer 243. The insulating layers 231 and 233 prevent unnecessary interlayer contact of the first and second electrode layers 241 and 242, the third electrode layer 243, the first and second pads 245 and 247, and the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the first and second pads 245 and 247. The first and second pads 245 and 247 may include the same material as the first and second lead electrodes 415 and 417.

The third electrode layer 243 is connected to the first conductive semiconductor layer 222. A connection portion 244 of the third electrode layer 243 protrudes in a via structure through a lower portion of the first and second electrode layers 241 and 242 and the light emitting structure 225 and contacts the first conductive semiconductor layer 222. The connection portion 244 may be plurally provided. A portion 232 of the first insulating layer 231 extends around the connection portion 244 of the third electrode layer 243 to prevent electrical connection of the third electrode layer 243 to the first and second electrode layers 241 and 242, the second conductive semiconductor layer 224, and the active layer 223. An insulating layer may be disposed on a side surface of the light emitting structure 225 so as to protect the side surface of the light emitting structure 225, but embodiments are not limited thereto.

The second pad 247 is disposed under the second insulating layer 233, and contact or is connected to at least one of the first and second electrode layers 241 and 242 through an open region of the second insulating layer 233. The first pad 245 is disposed under the second insulating layer 233 and is connected to the third electrode layer 243 through the open region of the second insulating layer 233. Accordingly, a protrusion 248 of the first pad 245 is electrically connected to the second conductive semiconductor layer 224 through the first and second electrode layers 241 and 242, and a protrusion 246 of the second pad 245 is electrically connected to the first conductive semiconductor layer 222 through the third electrode layer 243.

The first and second pads 245 and 247 are spaced apart from each other under the light emitting chip 200A and face the first and second lead electrodes 415 and 417 of the circuit board 400. The first and second pads 245 and 247 may include polygonal recesses 271 and 273, and the recesses 271 and 273 are formed convexly toward the light emitting structure 225. The recesses 271 and 273 may be formed to have a depth equal to or less than a thickness of the first and second pads 245 and 247. The depth of the recesses 271 and 273 may increase a surface area of the first and second pads 245 and 247.

Bonding members 255 and 257 are disposed in a region between the first pad 245 and the first lead electrode 415 and a region between the second pad 247 and the second lead electrode 417. The bonding members 255 and 257 may include an electrically conductive material and a portion thereof is disposed in the recesses 271 and 273. Since the bonding members 255 and 257 are disposed in the recesses 271 and 273, a bonding area between the bonding members 255 and 257 and the first and second pads 215 and 217 may be increased. Accordingly, since the first and second pads 245 and 247 are bonded to the first and second lead electrodes 415 and 417, it is possible to improve electrical reliability and heat dissipation efficiency of the light emitting chip 200A.

The bonding members 255 and 257 may include a solder paste material. The solder paste material includes at least one of gold (Au), tin (Sn), lead (Pb), copper (Cu), bismuth (Bi), indium (In), and silver (Ag). Since the bonding members 255 and 257 directly transfer heat to the circuit board 400, heat transfer efficiency may be further improved than a structure using a package. Also, since the bonding members 255 and 257 are materials having a small difference in thermal expansion coefficient with respect to the first and second pads 245 and 247 of the light emitting chip 200A, heat transfer efficiency may be improved.

As another example, the bonding members 255 and 257 may include a conductive film, and the conductive film includes one or more conductive particles in the insulating film. The conductive particle may include at least one of a metal, a metal alloy, and carbon. The conductive particle may include at least one of nickel, silver, gold, aluminum, chromium, copper, and carbon. The conductive film may include an anisotropic conductive film or an anisotropic conductive adhesive.

An adhesive member, for example, a thermally conductive film, may be included between the light emitting chip 200A and the circuit board 400. The thermally conductive film may include: a polyester resin such as polyethylene terephthalate, polybutylene terephthalate, polyethylene naphthalate, or polybutylene naphthalate; a polyimide resin; an acrylic resin; a styrene-based resin such as polystyrene and acrylonitrile styrene; a polycarbonate resin; a polylactic acid resin; and a polyurethane resin. Also, the thermally conductive film may include: a polyolefin resin such as polyethylene, polypropylene, and ethylene-propylene copolymer; a vinyl resin such as polyvinyl chloride and polyvinylidene chloride; a polyamide resin; a sulfonic resin; a polyether-ether ketone resin; arylate-based resin; or blend of the resins.

The light emitting chip 200A emits light through the surface of the circuit board 400 and the side surface and top surface of the light emitting structure 225, thereby improving light extraction efficiency. Since the light emitting chip 200A can be directly bonded on the circuit board 400, the process can be simplified. Also, sine the heat dissipation of the light emitting chip 200A is improved, it can be usefully used in illumination fields.

The light source unit or the light unit according to the embodiment may be applied to a display device, and the display device may be applied to various portable terminals, a monitor of a notebook computer, a monitor of a laptop computer, a television, and the like. The light unit according to the embodiment includes a structure having one or a plurality of light emitting modules, and may include a three-dimensional display, various illumination lights, a traffic light, a vehicle headlight, an electric signboard, and the like.

The features, structures, effects and the like described in the embodiments are included in at least one embodiment of the present invention, and are not necessarily limited to only one embodiment. Furthermore, the features, structures, effects and the like illustrated in the embodiments may be combined and modified by other persons skilled in the art to which the embodiments belong. Therefore, it is to be understood that is not limited to these embodiments.

While the invention has been shown and described with reference to certain preferred embodiments thereof, it will be understood by those skilled in the art that various changes in form and details may be made therein without departing from the spirit and scope of the invention as defined by the appended claims. It may be seen that various modifications and applications are possible. For example, each component specifically shown in the embodiments may be modified and implemented. It is to be understood that the present invention may be embodied in many other specific forms without departing from the spirit or essential characteristics thereof.

INDUSTRIAL APPLICABILITY

The present invention may be applied to various light source modules using a light source unit having a light emitting device and an optical lens.

The present invention may be applied to various lighting apparatuses using a light source unit having a fixing plate to which a light emitting device and an optical lens are coupled.

The present invention may be applied to various display apparatuses by using a light source unit having a light emitting device and an optical lens.

What is claimed is:

1. A light source unit comprising:
    a fixing plate including an opening portion;
    a light emitting device disposed in an opening portion of the fixing plate;
    a circuit board disposed under the fixing plate, and
    an optical lens disposed on the fixing plate,
    wherein the fixing plate includes a plurality of fixing portions,
    wherein the optical lens includes a bottom surface on the fixing plate, a concave recess on the opening portion of the fixing plate, a light incident surface around the recess and a light exit surface for emitting light incident on the incident surface,
    wherein an upper portion of the fixing plate and the bottom surface of the optical lens includes a coupling means coupling the fixing plate to the optical lens,
    wherein the fixing plate is spaced apart from a side surface and a lower surface of the light emitting device, wherein the opening portion is penetrated through a top surface and a lower surface of the fixing plate in a vertical direction, wherein a lower portion of the opening portion has a width wider than a width of the light emitting device and is penetrated in the vertical direction, and wherein the circuit board includes a plurality of lead electrodes disposed under the opening portion of the fixing plate and connected to the light emitting device, and a fixing pattern connected to each of the fixing portions of the fixing plate.

2. The light source unit of claim 1, wherein the coupling means includes a fixing groove disposed on the fixing plate, and a fixing protrusion coupled with the fixing groove on the bottom surface of the optical lens.

3. The light source unit of claim 2, further comprising a phosphor film between the light emitting device and the optical lens.

4. The light source unit of claim 3, wherein the fixing plate has a stepped structure in which an outer portion of the phosphor film is disposed around an upper portion of the opening portion.

5. The light source unit of claim 3, wherein the optical lens has a stepped structure around a lower portion of the recess, and wherein the outer portion of the phosphor film is disposed between the fixing plate and the bottom surface of the optical lens and is coupled to the stepped structure.

6. The light source unit of claim 2, wherein the fixing groove of the fixing plate is disposed around the opening portion, and wherein the fixing protrusion of the optical lens protrudes lower than the bottom surface of the optical lens around the recess.

7. The light source unit of claim 2, wherein the fixing grooves and the fixing protrusions are circular or polygonal ring-shape in a top view shape and are arranged continuously or discontinuously.

8. The light source unit of claim 1, wherein the fixing plate includes a body of a resin material, wherein the fixing portion protrudes from a bottom of the body to different sides and including a metal material, wherein the plurality of fixing portions and the fixing plate are electrically insulated from the light emitting device, and wherein a height of the opening portion is equal to a thickness of the fixing plate.

9. The light source unit to claim 1, wherein the fixing plate includes a metal material, wherein the fixing plate includes a supporting portion disposed under the optical lens, a first leg portion bent from a first outer side of the supporting portion and a second leg portion bent from a second outer side of the supporting portion, wherein each of the first and second leg portions is connected to a separate corresponding one of the fixing portions, and wherein the fixing plate is electrically insulated from the light emitting device.

10. The light source unit of claim 1, wherein the opening portion of the fixing plate includes a sidewall bent in a direction of the lower surface of the fixing plate, and an extending portion bent from the sidewall in the direction of the light emitting device.

11. The light source unit of claim 1, wherein the bottom surface of the optical lens includes a flat first bottom portion facing an inner region of the top surface of the fixing plate, and an inclined second bottom portion spaced apart from an outer region of a top surface of the fixing plate.

12. The light source unit of claim 1, wherein the top surface of the fixing plate has an area equal to or larger than a bottom area of the optical lens, and wherein the top surface of the fixing plate is disposed higher than a top surface of the light emitting device.

13. The light source unit of claim 1, wherein the light emitting device comprises a light emitting chip emitting light from at least five surfaces, and a phosphor layer on the light emitting chip, and wherein the light exit surface of the optical lens has a first light exit surface whose center region is convex upward and a second light exit surface between the first light exit surface and the bottom surface.

14. The light source unit according to claim 1, wherein the optical lenses are different in length in two directions passing through the center of the bottom surface and orthogonal to each other.

15. A light source unit comprising:

a fixing plate including an opening portion penetrating through a lower surface and a top surface thereof;

a light emitting device disposed in an opening portion of the fixing plate; and an optical lens disposed on the fixing plate, wherein the fixing plate includes a plurality of fixing portions, wherein the optical lens includes a bottom surface disposed on the fixing plate, a recess on the opening portion of the fixing plate, and an light exit surface for emitting light, wherein the fixing plate includes a fixing groove at an upper portion thereof, wherein the optical lens includes a fixing protrusion protruding in a direction of the fixing groove, wherein the fixing plate is spaced apart from a side surface and a lower surface of the light emitting device, wherein a thickness of the fixing plate is smaller than a height of the opening portion, wherein the fixing plate and the fixing portions are formed of a metal material and are electrically insulated from the light emitting device, and wherein a lower portion of the opening portion has a width wider than a width of the light emitting device and penetrates in a vertical direction.

16. The light source unit of claim 15, wherein a lower surface of the light emitting device is exposed through a lower portion of the opening portion, and wherein a bottom width of the recess of the optical lens is equal to or smaller than an upper width of the opening portion.

17. The light source unit according to claim 15, wherein a side wall of the opening portion is formed by the fixing plate.

18. The light source unit of claim 15, wherein the thickness of the fixing plate ranges from 0.2 mm to 0.3 mm, and wherein an upper width of the opening portion is in the range of 1.4 mm to 1.8 mm.

19. The light source unit of claim 15, further comprising:

a circuit board disposed under the fixing plate, wherein a top surface of the circuit board is connected through the opening portion, wherein the circuit board has a plurality of lead electrodes facing the opening portion of the fixing plate and connected to the light emitting device, and a fixed pattern connected to the fixing portion of the fixing plate.

20. A light source unit comprising:

a fixing plate including an opening portion;

a light emitting device disposed in an opening portion of the fixing plate; and an optical lens disposed on the fixing plate, wherein the fixing plate includes a plurality of fixing portions, wherein the optical lens includes a bottom surface on the fixing plate, a concave recess on the opening portion of the fixing plate, a light incident surface around the recess and a light exit surface for emitting light incident on the incident surface, wherein an upper portion of the fixing plate and the bottom surface of the optical lens includes a coupling means coupling the fixing plate to the optical lens, wherein the fixing plate is spaced apart from a side surface and a lower surface of the light emitting device, wherein the opening portion is penetrated through a top surface and a lower surface of the fixing plate in a vertical direction, wherein a lower portion of the opening portion has a width wider than a width of the light emitting device and is penetrated in the vertical direction, and wherein the fixing plate includes a metal material, wherein the fixing plate includes a supporting portion disposed under the optical lens, a first leg portion bent from a first outer side of the supporting portion and a second leg portion bent from a second outer side of the supporting portion, wherein each of the first and second leg portions is connected to a separate corresponding one of the fixing portions, and wherein the fixing plate is electrically insulated from the light emitting device.

* * * * *